(12) United States Patent
Ejiri et al.

(10) Patent No.: US 8,997,341 B2
(45) Date of Patent: Apr. 7, 2015

(54) SUBSTRATE FOR MOUNTING SEMICONDUCTOR CHIP AND METHOD FOR PRODUCING SAME

(75) Inventors: Yoshinori Ejiri, Chikusei (JP); Kiyoshi Hasegawa, Chikusei (JP); Takehisa Sakurai, Chikusei (JP); Yoshiaki Tsubomatsu, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 195 days.

(21) Appl. No.: 13/394,688

(22) PCT Filed: Sep. 6, 2010

(86) PCT No.: PCT/JP2010/065229

§ 371 (c)(1),
(2), (4) Date: May 29, 2012

(87) PCT Pub. No.: WO2011/027884

PCT Pub. Date: Mar. 10, 2011

(65) Prior Publication Data

US 2012/0234584 A1   Sep. 20, 2012

(30) Foreign Application Priority Data

Sep. 7, 2009   (JP) .............................. P2009-205856

(51) Int. Cl.
*H05K 3/46* (2006.01)
*H05K 3/42* (2006.01)
(Continued)

(52) U.S. Cl.
CPC ............ *H05K 3/244* (2013.01); *H01L 21/4857* (2013.01); *H05K 3/062* (2013.01);
(Continued)

(58) Field of Classification Search
CPC ................................ H05K 3/465; H05K 3/42
USPC ........... 29/846, 847, 850, 852, 853, 874, 841; 174/261, 262, 265, 257; 261/13
See application file for complete search history.

(56) References Cited

U.S. PATENT DOCUMENTS 4,720,324 A * 1/1988 Hayward .................... 216/18
6,156,218 A   12/2000 Okubo
(Continued)

FOREIGN PATENT DOCUMENTS

CN   1460131 A   12/2003
CN   1842254 A   10/2006
(Continued)

OTHER PUBLICATIONS

International Search Report issued in corresponding application No. PCT/JP2010/065229, completed Sep. 17, 2010 and mailed Sep. 28, 2010.
(Continued)

*Primary Examiner* — Peter DungBa Vo
*Assistant Examiner* — Kaying Kue
(74) *Attorney, Agent, or Firm* — Griffin & Szipl, P.C.

(57) ABSTRACT

It is an object of the invention to provide a method for producing a substrate for mounting a semiconductor chip, that can reduce bridging and allows excellent wire bondability and solder connection reliability to be obtained, even when forming fine-pitch wirings. The method for producing a substrate for mounting a semiconductor chip according to the invention comprises a resist-forming step in which a resist is formed on the first copper layer of a stack comprising an inner board with an inner layer circuit on the surface and a first copper layer formed on the inner board separated by an insulating layer at the sections other than those that are to constitute a conductor circuit, a conductor circuit-forming step in which a second copper layer is formed by electrolytic copper plating on the first copper layer to obtain a conductor circuit, a nickel layer-forming step in which a nickel layer is formed by electrolytic nickel plating on at least part of the conductor circuit, a resist removal step in which the resist is removed, an etching step in which the first copper layer is removed by etching, and a gold layer-forming step in which a gold layer is formed by electroless gold plating on at least part of the conductor circuit.

12 Claims, 14 Drawing Sheets

(51) Int. Cl.
*H05K 3/24* (2006.01)
*H01L 21/48* (2006.01)
*H05K 3/06* (2006.01)
*H05K 3/10* (2006.01)

(52) U.S. Cl.
CPC ............. *H05K 3/108* (2013.01); *H05K 3/4644* (2013.01); *H05K 3/4652* (2013.01); *H01L 2924/00013* (2013.01); *H01L 2924/0002* (2013.01)

(56) References Cited

U.S. PATENT DOCUMENTS

| | | | |
|---|---|---|---|
| 6,811,828 | B2 | 11/2004 | Takahashi et al. |
| 6,931,722 | B2* | 8/2005 | Arrington et al. ............... 29/847 |
| 7,230,188 | B1* | 6/2007 | En et al. ......................... 174/257 |
| 7,347,949 | B2* | 3/2008 | Miyagawa et al. ............. 216/95 |
| 7,388,159 | B2* | 6/2008 | Asai ............................... 174/262 |
| 7,462,555 | B2* | 12/2008 | Lee ................................ 438/612 |
| 7,545,049 | B2* | 6/2009 | Sunohara et al. ............. 257/778 |
| 7,681,310 | B2 | 3/2010 | Chinda et al. |
| 7,802,361 | B2* | 9/2010 | Yoon et al. ..................... 29/852 |
| 8,065,794 | B2* | 11/2011 | En et al. .......................... 29/847 |
| 8,087,164 | B2 | 1/2012 | Tanno et al. |
| 2003/0177635 | A1* | 9/2003 | Arrington et al. ............... 29/830 |
| 2003/0178229 | A1* | 9/2003 | Toyoda et al. ................ 174/261 |
| 2004/0028833 | A1 | 2/2004 | Takahashi et al. |
| 2004/0110319 | A1* | 6/2004 | Fukutomi et al. ............. 438/106 |
| 2004/0178510 | A1 | 9/2004 | Sunohara et al. |
| 2005/0202261 | A1* | 9/2005 | Takai et al. .................... 428/458 |
| 2005/0269206 | A1 | 12/2005 | Tanaka et al. |
| 2006/0145359 | A1 | 7/2006 | Sunohara et al. |
| 2006/0219428 | A1 | 10/2006 | Chinda et al. |
| 2007/0013048 | A1* | 1/2007 | Sunohara et al. ............. 257/698 |
| 2007/0056767 | A1* | 3/2007 | Asai ............................... 174/262 |
| 2008/0302560 | A1 | 12/2008 | Tanno et al. |
| 2009/0084598 | A1* | 4/2009 | Jomaa ........................... 174/263 |
| 2009/0200069 | A1* | 8/2009 | Kariya et al. ................. 174/255 |
| 2009/0206471 | A1 | 8/2009 | Sunohara et al. |
| 2011/0051387 | A1 | 3/2011 | Tachibana et al. |
| 2012/0031659 | A1 | 2/2012 | Tanno et al. |

FOREIGN PATENT DOCUMENTS

| | | |
|---|---|---|
| CN | 101356642 A | 1/2009 |
| JP | 3-283556 A | 12/1991 |
| JP | 09-241853 | 9/1997 |
| JP | 10-242203 A | 9/1998 |
| JP | 11-124680 | 5/1999 |
| JP | 2002-016100 A | 1/2002 |
| JP | 2002-111188 A | 4/2002 |
| JP | 3387507 | 1/2003 |
| JP | 2003-051658 A | 2/2003 |
| JP | 2003-258161 A | 9/2003 |
| JP | 2004-247475 | 9/2004 |
| JP | 2007-096007 | 4/2007 |
| JP | 2007-142376 | 6/2007 |
| JP | 2008-109087 | 5/2008 |
| KR | 10-0514230 B1 | 9/2005 |
| KR | 10-2006-0048174 A | 5/2006 |
| KR | 10-2011-0016410 A | 2/2011 |
| TW | 200920876 | 5/2009 |
| WO | 99/31293 | 6/1999 |

OTHER PUBLICATIONS

Hasegawa, Kiyoshi et al. "Electroless Ni/Pd/Au Plating for Semiconductor Package Substrate," Journal of the Surface Finishing Society of Japan, vol. 57, No. 9., 2006, pp. 616-621.

Kudo, Tomio, "Chemistry of Gold Plating," The Journal of the Japan Institute of Printed Circuit, Electronic circuit & packaging technology, vol. 8, No. 5, 1993, pp. 368-372.

International Preliminary Report on Patentability issued Apr. 11, 2012 issued in corresponding application No. PCT/JP2010/065229.

Notice of Allowance issued in related Korean application 10-2012-7008121 on Dec. 20, 2013 (no translation available; submitted for certification).

Taiwanese Office Action issued in counterpart application 099130195 on Mar. 24, 2014 (no translation available; submitted for certification).

Chinese Office Action issued in counterpart application 201080039774.5 on Mar. 26, 2014 (no translation available; submitted for certification).

Office Action issued in counterpart Japanese application P2013-176904 on Jul. 1, 2014 (no translation available; submitted for certification purposes).

* cited by examiner

US 8,997,341 B2

SUBSTRATE FOR MOUNTING SEMICONDUCTOR CHIP AND METHOD FOR PRODUCING SAME

This is a National Phase Application in the United States of International Patent Application No. PCT/JP2010/065229 filed Sep. 6, 2010, which claims priority on Japanese Patent Application No. P2009-205856, filed Sep. 7, 2009. The entire disclosures of the above patent applications are hereby incorporated by reference.

TECHNICAL FIELD

The present invention relates to a substrate for mounting a semiconductor chip and to a method for producing it.

BACKGROUND ART

In recent years, continuing advancements have been made in size and weight reduction, high performance and high functionality of electronic devices such as personal computers, cellular phones, wireless base stations, optical communication devices, servers and routers, of various sizes. With the increasing speeds and higher performance of LSIs such as CPUs, DSPs and various memory chips, development has also been carried out on high-density mounting techniques such as SoC (System on a chip) and SiP (System In Package).

Build-up system-type multilayer circuit boards are therefore being employed on semiconductor chip-mounting substrates and motherboards. With advancements in mounting technologies such as multi-pin and narrow-pitch formation on packages, semiconductor chip-mounting substrates have been shifting from QFP (Quad Flat Package) to BGA (Ball Grid Array)/CSP (Chip Size Package) mounting.

Connection between semiconductor chip-mounting substrates and semiconductor chips is accomplished using gold wire bonding, for example. Semiconductor chip-mounting substrates connected with semiconductor chips are also connected with circuit boards (motherboards) by solder balls. Substrates for mounting semiconductor chips usually have connecting terminals for connection with semiconductor chips or circuit boards. Most connecting terminals are gold plated to ensure satisfactory metal bonding with gold wire or solder.

Electrolytic gold plating has been widely employed in the prior art as a method of gold plating connecting terminals. However, with the recent increase in high density of wirings due to smaller substrates for mounting semiconductor chips, it is becoming difficult to secure the wirings for forming electrolytic gold plating on connecting terminal surfaces. Processes of electroless gold plating (displacement gold plating or reduction gold plating), that do not require lead wires for electrolytic plating, are therefore attracting interest as methods of gold plating onto connecting terminals. For example, formation of an electroless nickel plating film/electroless gold plating films on the copper foil surfaces of terminal sections is known, as described in Non-patent document 1.

However, it is known that in electroless nickel plating/electroless gold plating methods, the solder connection reliability or post-heat treatment wire bondability is reduced, compared to electrolytic nickel plating/electrolytic gold plating methods, as taught in Non-patent document 2.

In addition, electroless nickel plating on wirings produces a phenomenon of deposition of the electroless nickel plating film between wirings, known as "bridging", which can sometimes cause short circuiting. In order to inhibit bridging, there have been proposed pretreatment solutions and pretreatment methods designed to prevent bridging, as disclosed in Patent documents 1 and 2, for example. There have also been disclosed electroless plating catalyst solutions to prevent bridging, as in Patent document 3.

CITATION LIST

Patent Literature

[Patent document 1] Japanese Unexamined Patent Application Publication HEI No. 9-241853
[Patent document 2] Japanese Patent No. 3387507
[Patent document 3] Japanese Unexamined Patent Application Publication HEI No. 11-124680

Non-Patent Literature

[Non-patent Document 1] Journal of the Printed Circuit Institute, "Circuit Technology" (1993, Vol. 8 No. 5 p. 368-3'72).
[Non-patent document 2] Hyoumen Gijutsu [Surface Technology] (2006, Vol. 57 No. 9 p. 616-621)

SUMMARY OF INVENTION

Technical Problem

In recent years, wiring formation methods such as semi-additive processes have begun to be utilized for mass production of products with ultrafine patterns having inter-pattern spacings of less than 50 µm, such as fine-pitch wiring with wiring width/wiring gap (hereunder abbreviated as "L/S")=35 µm/35 µm.

For substrates having such ultrafine patterns, the following method is known as prior art for forming connecting terminals by electroless nickel plating of copper circuits followed by electroless gold plating thereover.

Specifically, a semi-additive process employing a copper foil-coated resin is known, which is carried out by:
(1) a step of laminating a copper foil-coated resin above and below an inner board having an inner layer circuit on the surface,
(2) a step of forming interstitial via holes (IVH) in the copper foil-coated resin and forming an electroless copper plating layer on the copper foil and inside the IVH,
(3) a step of forming an electrolytic plating resist on the sections of the electroless copper plating layer other than those on which the conductor circuit is to be formed,
(4) a step of forming a copper circuit by electrolytic copper plating at the sections on which the conductor circuit is to be formed,
(5) a step of releasing the electrolytic plating resist,
(6) a step of using an etching solution for etching to remove the copper foil and electroless copper plating layer on the sections other than those on which the conductor circuit is to be formed,
(7) a step of forming a solder resist pattern on the surface of a substrate on which a conductor circuit has been formed,
(8) a step of forming an electroless nickel plating film on the conductor circuit, and
(9) a step of further forming an electroless gold plating film on the outer surface of the conductor circuit. That is, electroless nickel plating (step (8))/electroless gold plating (step (9)) is carried out at specific locations on a copper conductor circuit, to form connecting terminals.

As mentioned above, with increasingly high density wirings due to micronization of substrates for mounting semiconductor chips, it is becoming essential to use electroless plating techniques that do not require lead wires, instead of the conventional electrolytic nickel/electrolytic gold plating processes, for connecting terminal sections. Consequently, electroless nickel plating/electroless gold plating is being applied even in the semi-additive process described above.

However, as a result of research by the present inventors, it has been found that when an electroless nickel plating solution is used for electroless nickel plating on fine-pitch wiring of approximately L/S=35 μm/35 μm, it is difficult to adequately ensure insulating reliability between conductors. Specifically, even when methods of reducing bridging are applied, such as with pretreatment solutions or pretreatment methods, or electroless plating catalyst solutions, as described in Patent documents 1-3, in the case of fine-pitch wirings the electroless nickel plating tends to be deposited on the base material between conductors, making it impossible to obtained a sufficient effect. In addition, it has been found that when electroless nickel plating/electroless gold plating is applied for fine-pitch wirings, the wire bondability and solder connection reliability are notably reduced compared to using electrolytic nickel plating/electrolytic gold plating.

It is an object of the present invention, which has been accomplished in light of these circumstances, to provide a method for producing a substrate for mounting a semiconductor chip, that can reduce bridging and allows excellent wire bondability and solder connection reliability to be obtained, even when forming fine-pitch wirings, as well as a substrate for mounting a semiconductor chip obtained by the method.

Solution to Problem

As a result of much diligent research by the present inventors with the aim of achieving this object, it was conjectured that the tendency toward bridging when an electroless nickel plating has been formed on copper wiring, in an ultrafine pattern with an inter-pattern spacing of less than 50 μm (for example, fine-pitch wiring of about L/S=35 μm/35 μm), may be partly due to nickel plating formation on the sides of the copper wiring by the electroless nickel plating. It was then found that bridging can be drastically reduced by inhibiting such nickel plating on the sides, and the concept of the invention was devised.

Specifically, the method for producing a substrate for mounting a semiconductor chip according to the invention comprises a resist-forming step in which a resist is formed on the first copper layer of a stack comprising an inner board with an inner layer circuit on the surface and a first copper layer formed on the inner board separated by an insulating layer so as to partially connect with the inner layer circuit, at the sections other than those that are to constitute a conductor circuit, a conductor circuit-forming step in which a second copper layer is formed by electrolytic copper plating on the sections of the first copper layer that are to constitute the conductor circuit, to obtain a conductor circuit comprising the first copper layer and the second copper layer, a nickel layer-forming step in which a nickel layer having an average crystal grain size of at least 0.25 μm on the side opposite the conductor circuit is formed by electrolytic nickel plating on at least part of the conductor circuit, a resist removal step in which the resist is removed, an etching step in which the first copper layer on the sections covered by the resist is removed by etching, and a gold layer-forming step in which a gold layer is formed by electroless gold plating on at least part of the conductor circuit on which the nickel layer has been formed.

In the method for producing a substrate for mounting a semiconductor chip according to the invention, after the resist for electrolytic plating has been formed on the first copper layer to match the pattern of the conductor circuit, a second copper layer is formed by electrolytic copper plating, and then a nickel layer is formed by electrolytic nickel plating. During the electrolytic nickel plating, therefore, the resist is present on the sections other than the conductor circuit, and this can prevent formation of the nickel plating on the sides of the conductor circuit. According to the invention, therefore, formation of bridges can be drastically decreased even with ultrafine patterns.

In addition, formation of the nickel layer on the conductor circuit in this manner allows satisfactory wire bondability and solder connection reliability to be obtained even with fine-pitch wirings, since it is accomplished by electrolytic nickel plating instead of electroless nickel plating. Furthermore, since formation of the gold layer on the nickel layer is accomplished by electroless gold plating, there is no need to use a lead wire as for electrolytic plating, and it is possible to accomplish satisfactory gold plating on sections that are to serve as independent terminals, even when forming fine-pitch wirings. This can therefore be applied for further micronized and higher density substrates for mounting semiconductor chips.

In a method for producing a substrate for mounting a semiconductor chip of this type, using at least a portion of the conductor circuit as the terminal for connection of a solder connecting terminal or wire bonding terminal, for example, and forming a nickel layer and gold layer especially on these sections, it is possible to obtain a substrate for mounting a semiconductor chip which has excellent wire bondability and solder connection reliability.

The method for producing a substrate for mounting a semiconductor chip according to the invention preferably comprises, after the etching step and before the gold layer-forming step, a solder resist-forming step in which a solder resist is formed on the surface so that at least part of the conductor circuit on which the nickel layer has been formed is exposed. This can protect the conductor circuit at areas where the gold layer will not be formed, and will facilitate formation of the gold layer at the desired locations on the conductor circuit while also preventing formation of bridges by the gold plating.

In the resist-forming step, after a resin-coated copper foil having an insulating layer composed mainly of a resin laminated on a copper foil, has been laminated on an inner board with the insulating layer facing the inner board side, a via hole has been formed in the resin-coated copper foil laminated on the inner board so as to expose part of the inner layer circuit, and a copper plating layer has been formed by electroless copper plating so as to cover the copper foil and the interior of the via hole, to obtain a stack with a first copper layer that comprises a copper foil and a copper plating layer and is partially connected to the inner layer circuit, a resist may be formed on the first copper layer of the stack at the sections other than those that are to serve as the conductor circuit.

In this case, the copper foil of the resin-coated copper foil and the copper plating layer formed by electroless copper plating can function as seed layers, while the first copper layer composed thereof has a second copper layer further laminated thereover, thereby forming a conductor circuit. Also, the resist-forming step allows a stack comprising the first copper layer to be satisfactorily obtained. A seed layer is a metal film serving as the base layer for electrolytic plating.

The thickness of the copper foil of the resin-coated copper foil in the resist-forming step is preferably no greater than 5

μm. The copper foil serving as the seed layer will therefore be thin, thereby facilitating removal of the seed layer (copper foil) remaining on the sections other than the conductor circuit after the resist has been removed, and allowing a more satisfactory conductor circuit to be formed.

In the resist-forming step, after a non-conductive film has been laminated on an inner board having an inner layer circuit on the surface to form an insulating layer, a via hole has been formed in the film laminated on the inner board so as to expose part of the inner layer circuit, and a copper plating layer has been formed by electroless copper plating so as to cover the insulating layer and the interior of the via hole, to obtain a stack with a first copper layer that comprises a copper plating layer and is partially connected to the inner layer circuit, a resist may be formed on the first copper layer of the stack at the sections other than those that are to serve as the conductor circuit.

In this case, the copper plating layer functions as the seed layer, while also composing the first copper layer which has a second copper layer laminated directly thereover and serves as a conductor circuit. Also, the resist-forming step allows a stack comprising such a first copper layer to be satisfactorily obtained on an inner board.

When such a copper plating layer alone serves as the seed layer it is easier to reduce the thickness compared to using a copper foil and a copper plating layer as the seed layer, and this is therefore preferred from the viewpoint of, for example, facilitating removal of the seed layer during the etching step. However, when the seed layer is formed from a copper foil and a copper plating layer, the catalyst applied before electroless copper plating becomes attached to the copper foil surface, and therefore is not directly applied to the surface of the insulating layer (excluding the IVH interiors). Attachment of the catalyst to the insulating layer can result in residue of the catalyst on the insulating layer surface even after removal of the seed layer, and action of the catalyst causes deposition of a plating film between conductor circuits, thus often resulting in short circuiting. Thus, from the viewpoint of inhibiting such short circuiting caused by the catalyst, the seed layer is preferably formed of a copper foil and a copper plating layer.

The method for producing a substrate for mounting a semiconductor chip according to the invention comprises, after the conductor circuit-forming step and before the nickel layer-forming step, an upper resist-forming step in which an upper resist is additionally formed covering the resist and conductor circuit so as to leave part of the conductor circuit exposed, in which case preferably the nickel layer is formed in the nickel layer-forming step on the conductor circuit exposed through the upper resist, and both the resist and upper resist are removed in the resist removal step.

Additionally forming such an upper resist will facilitate selective formation of the nickel layer on the sections of the conductor circuit which are to serve as the connecting terminals. In addition, this will avoid covering the entirety of the conductor circuit with the nickel layer, such that when the solder resist is formed on the sections other than those that are to serve as the connecting terminals in the solder resist-forming step, as mentioned above, the copper and solder resist that are to compose the conductor circuit can be closely bonded. According to research by the present inventors, a tendency has been found toward higher adhesion between copper and solder resists, compared to adhesion between nickel and solder resists, and therefore this method can further increase adhesiveness of solder resists for substrates, to further increase reliability.

In addition, after the nickel layer-forming step and before the gold layer-forming step, there may be carried out a metal layer-forming step in which a metal layer comprising at least one type of metal selected from the group consisting of cobalt, palladium and platinum is formed on the nickel layer by electroless plating or electrolytic plating. Such a metal layer will have a higher effect of inhibiting diffusion of nickel, and thus formation of such a metal layer on the nickel layer can help prevent diffusion of nickel and further increase the wire bondability, compared to direct formation of a gold layer.

Also, after the nickel layer-forming step and before the resist removal step, there may be carried out a metal layer-forming step in which a metal layer comprising gold is formed on the nickel layer. This can reduce the thickness of the gold layer which is to be formed by electroless gold plating when a gold layer is further formed on the outer surface of the conductor circuit in the gold layer-forming step described hereunder.

In particular, after the solder resist-forming step and before the gold layer-forming step, there is preferably carried out a metal layer-forming step in which a palladium layer is formed by electroless palladium plating on the nickel layer-formed conductor circuit which has been exposed through the solder resist. This will keep the palladium layer from being formed on the locations where the conductor circuit is not needed, thereby maintaining satisfactory adhesiveness between the conductor circuit and solder resist while obtaining a satisfactory effect of preventing nickel diffusion.

In the metal layer (palladium layer)-forming step, the palladium layer is preferably formed by reductive palladium plating after displacement palladium plating. This will allow elution of nickel from the nickel layer to be inhibited, compared to simultaneous displacement and reduction, so that a more satisfactory effect of increasing the wire bondability can be obtained.

Also, in the gold layer-forming step, the electroless gold plating is preferably carried out using an electroless gold plating solution containing a reducing agent, where the reducing agent is preferably one that does not generate hydrogen gas by oxidation. This can inhibit abnormal deposition of the gold plating that occurs due to hydrogen gas generated with oxidation.

In the gold layer-forming step as well, a gold layer is preferably formed by reductive gold plating after the displacement gold plating. This will produce satisfactory adhesiveness with the nickel layer formed on the lower layer or the metal in the metal layer, than with the gold layer, so that even more satisfactory wire bondability can be obtained.

The thickness of the gold layer formed in this manner is preferably 0.005 μm or greater. Forming the gold layer to such a thickness will tend to facilitate wire bonding.

The invention further provides a substrate for mounting a semiconductor chip, which is obtained by the production method of the invention described above. As mentioned above, this substrate for mounting a semiconductor chip has no bridging during production and is therefore resistant to short circuiting, while it also has excellent wire bondability and solder connection reliability.

Advantageous Effects of Invention

According to the invention it is possible to provide a method for producing a substrate for mounting a semiconductor chip, that can reduce bridging and allows excellent wire bondability and solder connection reliability to be obtained, even when forming fine-pitch wirings.

In addition, since the gold layer can be formed by electroless gold plating in the conductor circuit according to the invention, there is no need to use a lead wire as for electrolytic plating, and it is possible to accomplish satisfactory gold plating on sections that are to serve as independent terminals, even when forming fine-pitch wirings. The production method of the invention can therefore be applied for further micronized and higher density substrates for mounting semiconductor chips.

Moreover, according to the invention it is possible to provide a method for producing a substrate for mounting a semiconductor chip, that can be obtained by the production method of the invention described above, and that can reduce bridging and allows excellent wire bondability and solder connection reliability to be obtained.

DESCRIPTION OF EMBODIMENTS

Figure 1:
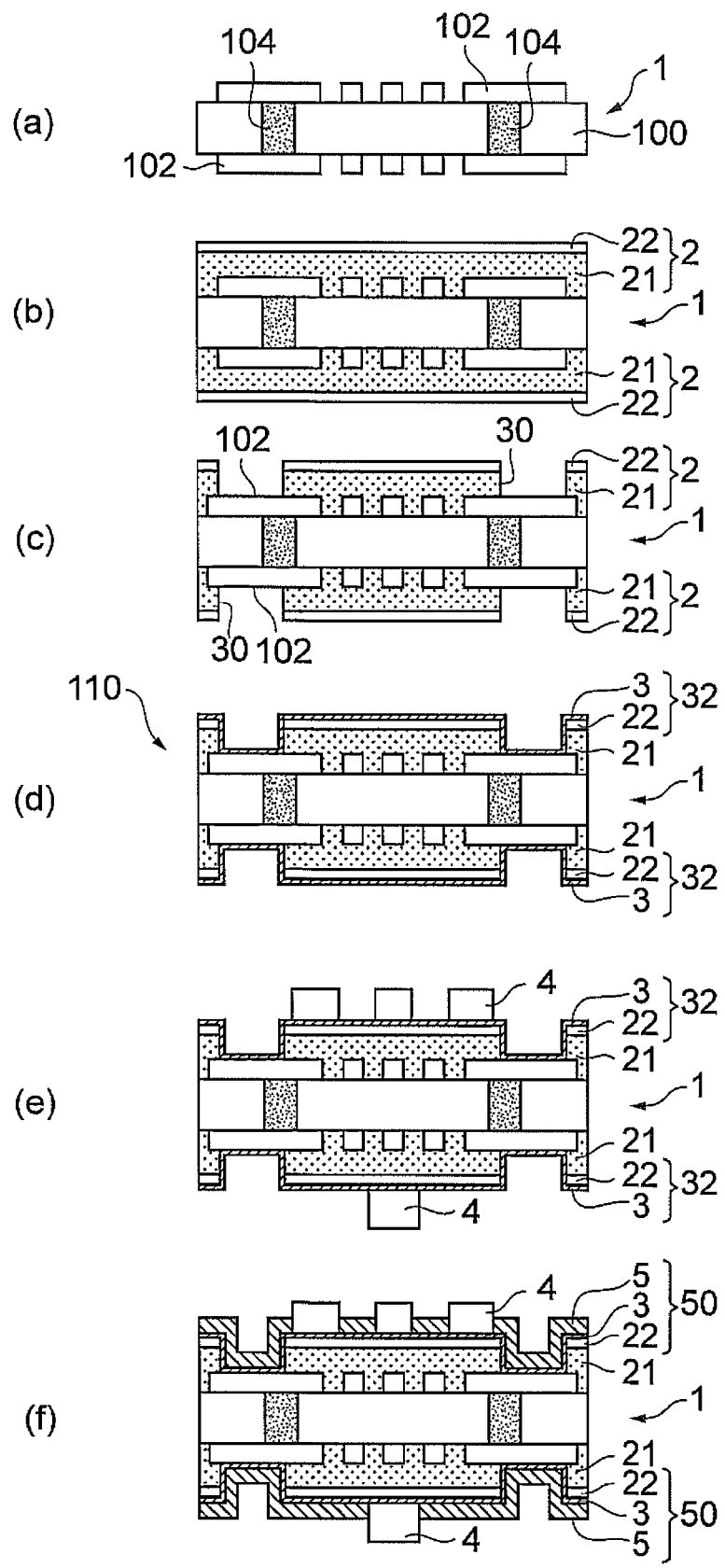
FIG. 1 is a process drawing schematically showing the method for producing a substrate for mounting a semiconductor chip according to a first embodiment.

Preferred embodiments of the invention will now be explained with reference to the accompanying drawings. Throughout the explanation of the drawings, corresponding elements will be referred to by like reference numerals and will be explained only once.

First Embodiment

Figure 2:
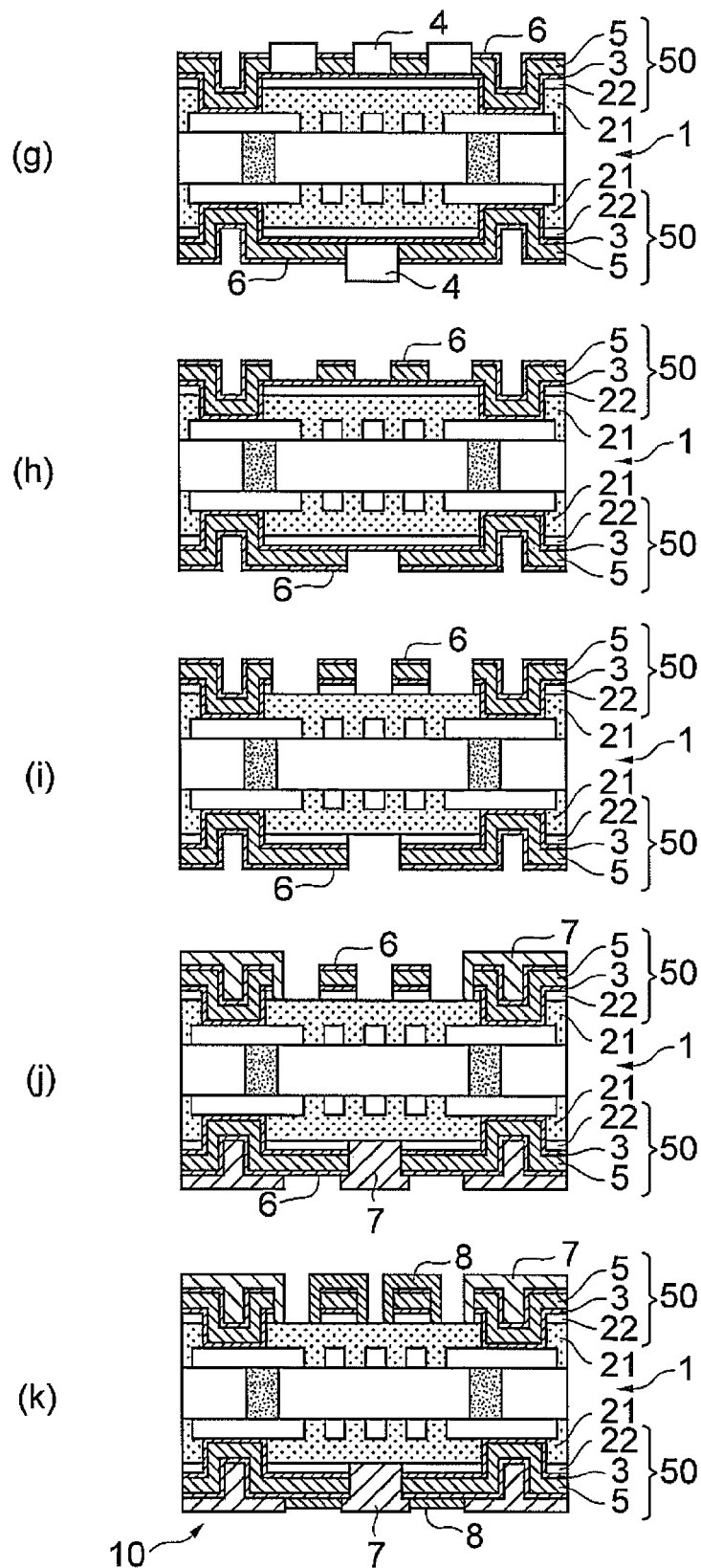
FIG. 2 is a process drawing schematically showing the method for producing a substrate for mounting a semiconductor chip according to a first embodiment.

A preferred first embodiment of a method for producing a substrate for mounting a semiconductor chip will now be explained. FIGS. 1 and 2 are process drawings schematically illustrating the method for producing a substrate for mounting a semiconductor chip according to a first embodiment. This embodiment is an example of a method for producing a substrate for mounting a semiconductor chip by a semi-additive process, wherein an outer layer circuit is formed on an inner board using a copper foil-coated resin.

According to this embodiment, an inner board 1 is prepared first, as shown in FIG. 1(a). The inner board 1 comprises an inner layer substrate 100, inner layer circuits 102 formed on its surface, and inner layer vias 104 formed through the inner layer substrate and electrically connecting the inner layer circuits 102 on both surfaces. The structures used for the inner board 1 may be known structures applied for circuit boards, without any particular restrictions.

The method of forming the inner board 1 may be one of the following methods, for example. First, there may be mentioned a method in which the copper foil is laminated as a metal layer onto both surfaces of the inner layer substrate 100 and then the unnecessary sections of the copper foil are removed by etching to form the inner layer circuits 102 (subtractive process), or a method in which the inner layer circuits 102 composed of copper are formed by electroless copper plating only on the necessary sections of both surfaces of the inner layer substrate 100 (additive process). There may also be mentioned a method in which a thin metal layer (seed layer) is formed on the surface of the inner layer substrate 100, or on a prescribed layer that has additionally been formed on the surface (build-up layer), with desired patterns corresponding to the inner layer circuits 102 being further formed by electrolytic copper plating, after which the thin metal layer on the sections where the pattern has not been formed are removed by etching, to form the inner layer circuits 102 (semi-additive process).

Next, as shown in FIG. 1(b), resin-coated copper foils 2, each comprising an insulating layer 21 composed mainly of a resin, laminated with a copper foil 22, are laminated onto both surfaces of the inner board 1, with each insulating layer 21 facing the inner board 1 side (FIG. 1(b)). Lamination of the resin-coated copper foils 2 can be accomplished, for example, by laminating or pressing against the inner board 1. For example, a common vacuum pressing machine may be used. The heating and pressing conditions are preferably conditions suited for the properties of the constituent materials of the insulating layer 21 which is to serve as an interlayer insulating resin. For example, the temperature may be 150° C.-250° C. and the pressure may be 1 MPa-5 MPa. According to this embodiment, the copper foil 22 of each resin-coated copper foil 2 functions as a seed layer, thus allowing formation of the copper plating layer 3 or second copper layer 5 described below. The insulating layer 21 of the resin-coated copper foil 2 before lamination is in the B-stage state.

The copper foil 22 of the resin-coated copper foil 2 has a thickness of preferably no greater than 5 μm and more preferably no greater than 3 μm. If the copper foil thickness is no greater than 5 μm, it is easier to accomplish the etching described hereunder, and it is easier to form fine-pitch wiring.

The copper foil 22 used is preferably a peelable type or etchable type. When the copper foil 22 is a peelable type, a copper foil with the desired thickness can be obtained by peeling off the carrier, and when it is an etchable type it can be obtained by etching the carrier. For example, in the case of a peelable type, a metal oxide or organic material layer serving as the release layer for the carrier may be removed by etching or the like, to peel off the carrier. In the case of an etchable type, where the metal foil is a copper foil and the carrier is an Al foil, an alkali solution can be used for etching of only the carrier. The copper foil 22 is more suited for fine-pitch wiring formation with a smaller thickness, within a range in which it functions as a power feed layer, and therefore the thickness can be reduced by further etching to obtain such a thickness. In this case, for a peelable type, it is efficient and preferred for the etching to be carried out simultaneously with removal of the release layer.

The resin composing the insulating layer 21 is a resin with an insulating property, and such a resin may be a thermosetting resin, a thermoplastic resin, or a blend of such resins. Organic insulating materials with a thermosetting property are preferred. Thermosetting resins include phenol resins, urea resins, melamine resins, alkyd resins, acrylic resins, unsaturated polyester resins, diallyl phthalate resins, epoxy resins, polybenzimidazole resins, polyamide resins, polyamideimide resins, silicone resins, cyclopentadiene-synthesized resins, tris(2-hydroxyethyl) isocyanurate-containing resins, aromatic nitrile-synthesized resins, trimerized aromatic dicyanamide resins, triallyl trimethacrylate-containing resins, furan resins, ketone resins, xylene resins, fused polycyclic aromatic ring-containing thermosetting resins, benzocyclobutene resins, and the like. Thermoplastic resins include polyimide resins, polyphenylene oxide resins, polyphenylene sulfide resins, aramid resins, liquid crystal polymers, and the like. The insulating layer 21 may also comprise an inorganic filler such as a silica filler, as necessary, or a prepreg containing a glass cloth may be used.

Next, as shown in FIG. 1(c), through-holes (via holes) are formed in the inner board 1 through the resin-coated copper foils 2, at prescribed locations where the resin-coated copper foils 2 are laminated on the inner board 1. This forms interstitial via holes (IVH) 30 so that portions of the inner layer circuits 102 are exposed. The through-holes can be formed, for example, by direct irradiation of laser light with an ultraviolet wavelength to form holes. If the third higher harmonic of a UV-YAG laser (wavelength of 355 nm) is used as the ultraviolet wavelength laser, a relatively high energy can be obtained, and this is preferred as it allows the machining speed to be increased.

For formation of the IVH 30, it is preferred to adjust the laser energy distribution and create a tapered form for the via hole cross-sectional shape, in order to increase the plating attachment in the holes. A via hole diameter of no greater than 50 μm will increase the machining speed, and is therefore preferred. Also, since the aspect ratio of the via holes (via hole height/via hole base diameter) is preferably no greater than 1 from the viewpoint of ensuring reliability, it is preferred for the design to have that relationship between the insulating layer 21 thickness and the via hole diameter during formation of the IVH 30. Because smearing may occur in the via holes, formation of the via holes is preferably followed by washing with a permanganate salt, chromate salt, permanganic acid or the like, to remove smears.

Next, as shown in FIG. 1(d), copper plating layers 3 are formed by electroless copper plating so as to cover the entirety of each resin-coated copper foil 2 laminated on the inner board 1. This yields a stack 110 comprising an inner board 1, and a first copper layer 32 comprising the copper foil 22 and copper plating layer 3, provided in a manner separated by the insulating layer 21 so as to be connected with portions of the inner layer circuit 102 of the inner board 1. In this stack 110, the surfaces of the copper foils 22 and the interiors of the IVH 30 are continuously covered by the first copper layers 32, and therefore the copper foils 22 formed on the surfaces of the insulating layers 21 and the inner layer circuits 102 are electrically connected.

The copper plating layer 3 may be formed by an electroless copper plating method used for common circuit board formation, and a catalyst which is to serve as the nucleus for electroless copper plating may be applied to the sections to be plated, and an electroless copper plating layer thinly formed thereover. The catalyst used may be a precious metal ion or palladium colloid, with palladium being particularly preferred because of its high adhesiveness with resins. An electroless copper plating solution that is commonly used for formation of circuit boards, composed mainly of copper sulfate, a complexing agent, formalin and sodium hydroxide, may be used for the electroless copper plating.

The thickness of the copper plating layer 3 may be a thickness that allows power feeding into the IVH 30, and is preferably 0.1-1 μm. If the copper plating layer 3 is thinner than 0.1 μm, it may not be possible to obtain sufficient power feeding between the copper composing the inner layer circuit 102 in the IVH 30 and the copper foil 22 of the resin-coated copper foil 2. A thickness of greater than 1 μm, on the other hand, will increase the thickness of the copper that must be etched in the etching step described hereunder, in which the copper on the sections other than those that are to constitute the conductor circuit are removed by etching, and therefore the circuit formability may be reduced making it difficult to form fine-pitch wiring. If the thickness of the copper plating layer 3 is 0.1-1 μm, sufficient power feeding will be obtained between the inner layer circuit 102 and copper foil 22, and etching in the etching step will be facilitated to obtain satisfactory circuit formability.

Next, as shown in FIG. 1(e), a resist 4 to serve as the electrolytic plating resist is formed on a prescribed location of each first copper layer 32 (resist-forming step). The locations were the resist 4 is formed are the sections other than those that are to serve as the conductor circuit of the first copper layer 32 (including the IVH 30). The resist 4 can be formed by applying a known resist forming method employing a material as described below. A positioning pattern to be used for positioning is also included in the sections that are to serve as the conductor circuit.

The thickness of each resist 4 is preferably about the same as or greater than the total thickness of the conductor to be subsequently plated. The resist 4 is preferably composed of a resin. Resists composed of resins include liquid resists such as PMER P-LA900PM (trade name of Tokyo Ohka Kogyo Co., Ltd.), and dry film resists such as HW-425 (trade name of Hitachi Chemical Co., Ltd.) and RY-3025 (trade name of Hitachi Chemical Co., Ltd.).

Next, as shown in FIG. 1(f), a second copper layer 5 is formed on the surface of each first copper layer 32 by electrolytic copper plating, to obtain a conductor circuit 50 in which the first copper layer 32 and second copper layer 5 are laminated (conductor circuit-forming step). In this step, electrolytic copper plating results in formation of the second copper layer 5 only on the sections where the resist 4 has not been formed. Thus, the second copper layer 5 is formed on the sections of the first copper layer 32 that are to serve as the conductor circuit 50.

The formation regions of the second copper layer 5 are determined by the resist 4, as mentioned above. Therefore, the electrolytic copper plating may be carried out with a lead wire attached to any sections of the first copper layer 32, and is adequately suitable even in cases of highly densified wiring. The electrolytic copper plating can be carried out using known copper sulfate electrolytic plating or pyrophosphate electrolytic plating, which are employed for production of substrates for mounting semiconductor chips.

The thickness of the second copper layer 5 may be a thickness allowing its use as a conductor circuit and will depend on the desired space, but it is preferably in the range of 1-30 µm, more preferably in the range of 3-25 µm and even more preferably in the range of 3-20 µm.

Next, as shown in FIG. 2(*g*), a nickel layer 6 is formed by electrolytic nickel plating on the surface of each second copper layer 5 (nickel layer-forming step). In this step as well, the nickel layer 6 is formed by electrolytic nickel plating only on the sections where the resist 4 has not been formed. The nickel layer 6 is thus formed over the entire region of the conductor circuit 50. In this step as well, the electrolytic nickel plating may be carried out with attachment of a lead wire to any section of the conductor circuit 50.

The electrolytic nickel plating can be carried out, for example, by dipping the entire substrate in an electrolytic nickel plating solution after the conductor circuit-forming step. The electrolytic nickel plating solution used may be a Watt bath (nickel plating bath composed mainly of nickel sulfate, nickel chloride and boric acid), a sulfamate bath (nickel plating path composed mainly of nickel sulfamate and boric acid), or a fluoroborate bath. The deposition film from a Watt bath will tend to have good adhesiveness with the conductor circuit 50 as the basis material, and can increase the corrosion resistance. A Watt bath is therefore preferably used for the electrolytic nickel plating.

Plating carried out using a Watt bath will tend to increase the crystal grain size of the nickel in the nickel layer 6. A Watt bath is therefore preferably used from this viewpoint as well. This is because when a gold layer 8 is to be formed by electroless gold plating in the gold layer-forming step described hereunder, the gold layer 8 is formed by epitaxial growth in which crystal growth occurs to some extent following the sizes of the nickel crystals of the base layer, and therefore larger nickel crystal grains will lead to formation of a gold plating film with larger crystal grains.

The nickel layer 6 is formed so that the side opposite the conductor circuit 50, i.e. the side which is to contact the gold layer 8 or metal layer 13 described below, has an average nickel crystal grain size of 0.25 µm or larger. The average crystal grain size on the surface of the nickel layer 6 is preferably 0.5 µm or larger and more preferably 1 µm or larger, with larger crystal grains being preferred. In most cases, a brightening agent is added to the electrolytic nickel plating solution, but brightening agents produce brightness by reducing the crystal grain sizes. For this reason, in order to obtain the crystal grain size specified above, the electrolytic nickel plating solution is preferably one with minimal addition of a brightening agent, and most preferably it contains no brightening agent. When an electrolytic nickel plating solution with low addition of a brightening agent is used, it is easy to form a nickel layer 6 with semigloss, and when an electrolytic nickel plating solution containing no brightening agent is used, it is easy to form a dull nickel layer 6.

A small gold crystal grain size in the gold layer 8 formed by electroless gold plating, described hereunder, will tend to reduce the effect of inhibiting diffusion of nickel from the nickel layer 6 into the gold layer 8. In this case, when heat treatment is carried out before wire bonding, for example, the nickel diffuses at the grain boundaries on the surface of the gold layer 8, and during the subsequent wire bonding, connection reliability between the gold wire and gold layer 8 surface can be reduced. With larger crystal grains of the gold in the gold layer 8, however, the effect of inhibiting grain boundary diffusion of nickel from the nickel layer 6 into the gold layer 8 tends to be increased. Thus, the surface of the nickel layer 6 formed by electrolytic nickel plating preferably has a higher nickel crystal grain size, and is preferably dull or semiglossy.

The thickness of the nickel layer 6 formed by the electrolytic nickel plating is preferably 0.4-10 µm, more preferably 0.6-8 µm and even more preferably 1-6 µm. If the thickness of the nickel layer 6 is at least 0.4 µm, a sufficient effect can be obtained as a barrier film for the copper conductor circuit of the lower layer, and the solder connection reliability will thereby be improved. Also, a thickness of at least 0.4 µm will result in sufficient growth of the nickel crystal grains, and it will thus be easier to obtain a gold layer 8 of crystal grains of sufficient size to inhibit grain boundary diffusion of nickel, in the gold layer-forming step. However, this effect is not further increased with a thickness exceeding 10 µm, which is also uneconomical, and therefore the thickness of the nickel layer 6 is preferably no greater than 10 µm.

In electrolytic nickel plating, the current density also tends to affect the crystal growth. Specifically, the current density for electrolytic nickel plating is preferably 0.3-4 A/dm$^2$, more preferably 0.5-3 A/dm$^2$ and even more preferably 0.8-2.5 A/dm$^2$. If the current density is at least 0.3 A/dm$^2$, the nickel crystal grains will undergo sufficient growth and the effect as a barrier film will be increased, such that the effect of the invention will be satisfactorily obtained. A higher current density within the aforementioned range will allow the nickel crystal grains to be increased in size, and therefore a higher current density is preferred. However, a current density of no greater than 4 A/dm$^2$ will tend to inhibit production of a rough plated surface (commonly referred to as "burnt deposits").

After the nickel layer-forming step, the resist 4, as the electrolytic plating resist, is removed, as shown in FIG. 2(*h*) (resist removal step). This causes the sections of the first copper layer 32 (copper plating layer 3) that were covered with the resist 4 to be exposed. Removal of the resist 4 can be accomplished by releasing the resist 4 using an alkaline release solution, sulfuric acid, or other commercially available resist release solution.

Then, as shown in FIG. 2(*i*), the sections of the first copper layer 32 (the copper foil 22 and copper plating layer 3) that were covered by the resist 4 are removed by etching (etching step). This removes all of the copper (first copper layer 32) other than the sections that are to serve as the conductor circuit, and forms a circuit pattern in which the surface of the conductor circuit 50 comprising the first copper layer 32 and second copper layer 3 are covered by the nickel layer 6.

The etching can be accomplished by dipping the substrate in an etching solution after the resist 4 has been removed. The etching solution may be a solution composed mainly of an acid other than a halogen, and hydrogen peroxide, and comprising a solvent and additives in addition to the main components. The solvent is preferably water from the viewpoint of cost, manageability and safety, and an alcohol or the like may also be added to the water. The additives may include a stabilizer such as hydrogen peroxide. Acids other than halogens include sulfuric acid and nitric acid, with sulfuric acid being preferably used. When etching is carried out using such an etching solution, the etching rate for the copper plating layer 3 is preferably adjusted to be no greater than 80% of the etching rate for the copper foil 22, in order to obtain a circuit pattern with the top width and bottom width according to design.

When sulfuric acid is used as an acid other than a halogen, the concentrations of the main components of the etching solution are preferably 10-300 g/L sulfuric acid and 10-200 g/L hydrogen peroxide water. Concentrations below these levels will tend to lower the etching rate, thereby impairing the workability. Concentrations above these levels will tend to excessively increase the etching rate, potentially interfering with control of the etching volume.

The etching rate for the first copper layer 32 is preferably controlled to 1-15 μm/min from the viewpoint of obtaining satisfactory workability. Also, since the difference in etching rate due to differences in crystal structure will depend on the temperature of the etching solution, the temperature of the etching solution during the etching is preferably 20-50° C. and more preferably 20-40° C. The etching time may be a suitably determined time for formation of the desired conductor pattern width, but from the viewpoint of satisfactory workability and etching uniformity it is preferably in the range of 10 seconds to 10 minutes.

The etching step is preferably followed by desmear treatment. This will allow remaining resin to be removed, even when the first copper layer 32 (copper plating layer 3) remains on the surface of the insulating layer within the conductor circuit 50 comprising the first copper layer 32 and second copper layer 3. Thus, in the gold layer-forming step described hereunder, it is possible to prevent deposition of gold on the first copper layer 32 remaining within the conductor circuit 50, thereby allowing insulating reliability to be further improved.

Also, after the etching step, and before the gold layer-forming step described hereunder, it is preferred to carry out a solder resist-forming step in which a solder resist 7 is formed on the surface in such a manner as to expose at least a portion of the conductor circuit 50 on which the nickel layer 6 has been formed, as shown in FIG. 2(*j*). The solder resist 7 can be formed, for example, so as to cover the sections of the conductor circuit 50 on which the nickel layer 6 has been formed (circuit pattern), other than those that are to serve as wire bonding terminals or solder connecting terminals. By forming such a solder resist 7 before the gold layer-forming step, it is possible to form the gold layer 8 only on the desired locations, and to protect the conductor circuit during electroless gold plating, while also reducing cost.

The solder resist 7 used may be made of a thermosetting or ultraviolet curing resin, and is preferably made of an ultraviolet curing that can be precisely worked into a resist shape. For example, an epoxy-based, polyimide-based, epoxy acrylate-based or fluorene-based resin material may be used. Pattern formation of the solder resist may be accomplished by printing, in the case of a varnish material, but from the viewpoint of further increasing the precision, it is more preferably accomplished by a known pattern forming method using a photosensitive solder resist, cover lay film or film resist.

Next, as shown in FIG. 2(*k*), a gold layer 8 is formed by electroless gold plating on the sections of the conductor circuit 50 on which the nickel layer 6 has been formed (circuit pattern), over which the solder resist 7 has not been formed (gold layer-forming step). This forms a gold layer 8 covering the top surface and sides of the conductor circuit 50 on which the nickel layer 6 has been formed, so that those sections can suitably function as connecting terminals such as wire bonding terminals or solder connecting terminals.

The gold layer 8 can be formed, for example, electroless gold plating, by displacement/reductive gold plating or by reductive gold plating after displacement gold plating. It may also be formed by performing electrolytic gold plating before the sections where the gold layer 8 is to be formed have become independent terminals, and then performing reductive electroless gold plating. The electroless gold plating may be accomplished using either method so long as the effect of the invention is obtained, but the method of reductive gold plating after displacement gold plating is preferred from the viewpoint of obtaining satisfactory adhesiveness with the lower layer metal (nickel, in this case), while the method of displacement/reductive gold plating will tend to inhibit elution of the lower layer metal (nickel, in this case) during plating, to allow formation of a satisfactory gold layer 8.

When reductive gold plating is to be performed after displacement gold plating, a specific method is one in which an approximately 0.01-0.1 μm gold plating base layer film (displacement gold plating film) is formed by a displacement gold plating solution such as HGS-100 (trade name of Hitachi Chemical Co., Ltd.), and then a gold plating finishing layer (reductive gold plating film) is formed thereover to about 0.1-1 μm using a reductive electroless gold plating solution such as HGS-2000 (trade name of Hitachi Chemical Co., Ltd.). However, the electroless gold plating method is not limited thereto, and any method applied for common gold plating may be used without any restrictions.

Figure 3:
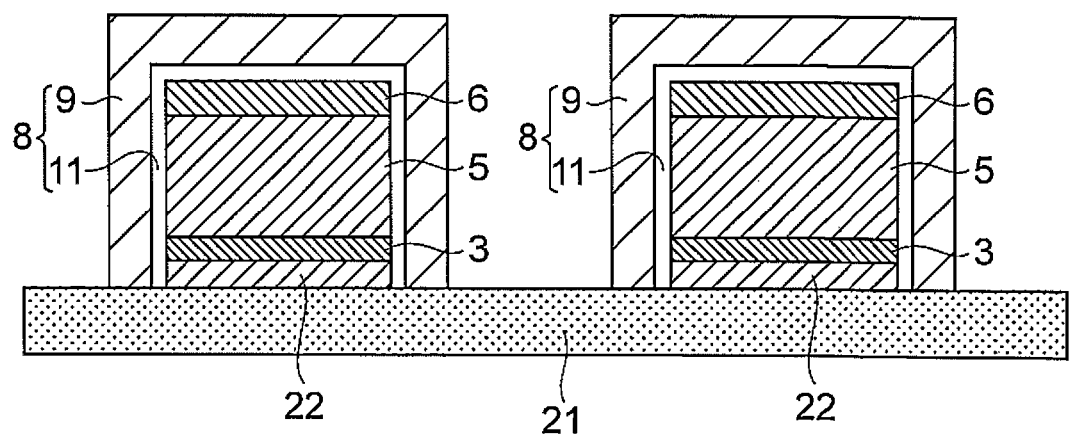
FIG. 3 is a schematic diagram showing a magnified view of the cross-sectional structure of a section of a conductor circuit 50 on which a gold layer 8 has been formed.

FIG. 3 is a schematic diagram showing a magnified view of the cross-sectional structure of a section of a conductor circuit 50 on which a gold layer 8 has been formed. This shows an example in which the electroless gold plating for formation of the gold layer 8 is carried out by reductive gold plating after the displacement gold plating described above. As shown in FIG. 3, at this section, a copper foil 22, a copper plating layer 3, a second copper layer 5 and a nickel layer 6 are laminated on an insulating layer 21 formed on the surface of an inner board 1 (not shown), and a gold layer 8 comprising a displacement gold plating film 11 and a reductive gold plating film 9 is formed covering the top surface and the sides of the multilayer structure.

The displacement gold plating film 11 can be formed on the top surface and sides of a conductor circuit 50 on which a nickel layer 6 has been formed. Plating solutions used for displacement gold plating include those containing and those not containing cyanogen compounds, and either type may be used as the plating solution. It is preferably one containing a cyanogen compound. The reason for this is that the uniformity of displacement gold plating on copper composing the conductor circuit 50 is more satisfactory when using a cyanogen-containing plating solution than when using a non-cyanogen-containing plating solution. When the reductive gold plating described below is carried out after displacement gold plating with such a cyanogen-containing plating solution, the gold layer 8 will tend to grow in a more uniform manner.

The reductive gold plating film 9 can be formed as an additional gold film on the displacement gold plating film 11. A thick gold layer 8 can thus be formed by performing reductive gold plating after displacement gold plating. The plating solution used for the reductive gold plating, by comprising a reducing agent, can form an autocatalytic gold layer. Such types of plating solution also include those containing and those not containing cyanogen compounds, and either type of plating solution may be used.

The reducing agent of the plating solution used for reductive gold plating is preferably one that does not generate hydrogen gas by oxidation. Reducing agents that generate little or no hydrogen gas include ascorbic acid, urea-based compounds and phenyl-based compounds. Reducing agents that generate hydrogen gas include phosphinic acid salts and hydrazine. Such a reducing agent-containing gold plating solution is preferably one that can be used at a temperature of about 60-80° C.

Displacement/reductive gold plating, on the other hand, accomplishes displacement gold plating and reductive gold plating reactions using the same solution, and allows formation of a gold layer 8 on the top surface and sides of the conductor circuit 50 on which the nickel layer 6 has been formed, similar to displacement gold plating. Such types of plating solution include those containing and those not containing cyanogen compounds, and either type of plating solution may be used. Electroless gold plating may also be carried out after the displacement/reductive gold plating, to form a thick gold layer.

The gold layer 8 formed in this manner preferably comprises gold with a purity of 99 wt % or greater. If the purity of gold in the gold layer 8 is less than 99 wt %, the connection reliability may be reduced when the section is used as a terminal. From the viewpoint of further increasing the connection reliability, the purity of the gold layer is more preferably 99.5 wt % or greater.

The thickness of the gold layer 8 is preferably 0.005-3 μm, more preferably 0.03-1 μm and even more preferably 0.1 μm-0.5 μm. A gold layer 8 thickness of at least 0.005 μm will tend to facilitate wire bonding when the section is used as a terminal. However, this effect is not further increased with a thickness exceeding 3 μm, and therefore the thickness is preferably no greater than 3 μm from an economical viewpoint.

In the steps described above, a substrate for mounting a semiconductor chip 10 is obtained having a construction in which conductor circuits 50, as outer layer circuits, are formed on both sides of an inner board 1 separated by insulating layers 21, and a nickel layer 6 and gold layer 8 are formed on the necessary sections of each conductor circuit 50. This type of substrate for mounting a semiconductor chip 10 allows the sections of each conductor circuit 50 on which the nickel layer 6 and gold layer 8 have been formed to function as wire bonding terminals or solder connecting terminals, so that connection with chip parts can be made at those sections.

In this method for producing a substrate for mounting a semiconductor chip, a metal layer 13 composed of a prescribed metal (see FIGS. 4 and 5) may be formed on the nickel layer 6, instead of forming the gold layer 8 directly on the nickel layer 6 as described above.

Specifically, at any point after the nickel layer-forming step and before the gold layer-forming step, there may be carried out a metal layer-forming step in which a metal layer 13 comprising at least one type of metal selected from the group consisting of cobalt, palladium, platinum and gold (see FIGS. 4 and 5) is formed on the nickel layer 6 by electroless plating or electrolytic plating.

Formation of the metal layer 13 is preferably accomplished after the nickel layer-forming step and before at least the etching step or solder resist-forming step, and more preferably it is carried out immediately after the nickel layer-forming step. This will help prevent peeling of the gold layer 8 when wire bonding has been performed on the obtained substrate for mounting a semiconductor chip, to obtain high wire bondability. The metal layer 13 is more preferably a metal layer comprising palladium.

When no metal layer 13 is formed, the adhesion between the gold layer 8 and nickel layer 6 may not be adequately obtained and peeling may occur between the gold layer 8 and nickel layer 6 when wire bonding has been accomplished. This is believed to occur because the surface of the nickel layer 6 becomes oxidized, depending on the conditions of heat treatment and the like for etching in the etching step or in the solder resist-forming step, and as a result its adhesion with the gold layer 8 is reduced. In contrast, forming a metal layer 13 on the nickel layer 6 inhibits peeling of the gold layer 8 and provides sufficient wire bondability. This is presumably because the cobalt, palladium, platinum or gold composing the metal layer 13 renders the surface resistant to oxidation and less affected by etching or heat treatment.

After the nickel layer 6 has been formed, sufficient adhesion between the gold layer 8 and nickel layer 6 can sometimes be obtained when no etching or heat treatment is carried out, or even when etching or heat treatment is carried out depending on the conditions, and therefore a metal layer-forming step is not always essential in such cases. From the viewpoint of reliably obtaining high wire bondability, however, when an etching step or solder resist-forming step is carried out, the metal layer 13 is more preferably formed on the nickel layer 6 before these steps. The reason for this is not completed understood, but palladium tends to have higher adhesion with solder resists than nickel, copper or gold. Thus, forming a palladium layer as the metal layer 13 increases adhesion of the solder resist 7 and more satisfactorily protects the conductor circuit 50.

Impurities in addition to cobalt, palladium, platinum and gold may sometimes be included in the metal layer 13 comprising one or more metals selected from the group consisting of cobalt, palladium, platinum and gold. For example, when a palladium metal layer has been formed by electroless palladium plating, it will sometimes contain phosphorus from the reducing agent and will be a palladium-phosphorus alloy.

When the metal layer-forming step has been carried out after the nickel layer-forming step and before the resist removal step, for example, the metal layer 13 is formed by the resist 4 only on the sections that are to serve as the conductor circuit. Therefore, the metal layer 13 is formed on the top surface of the nickel layer 6 on the conductor circuit 50.

Figure 4:
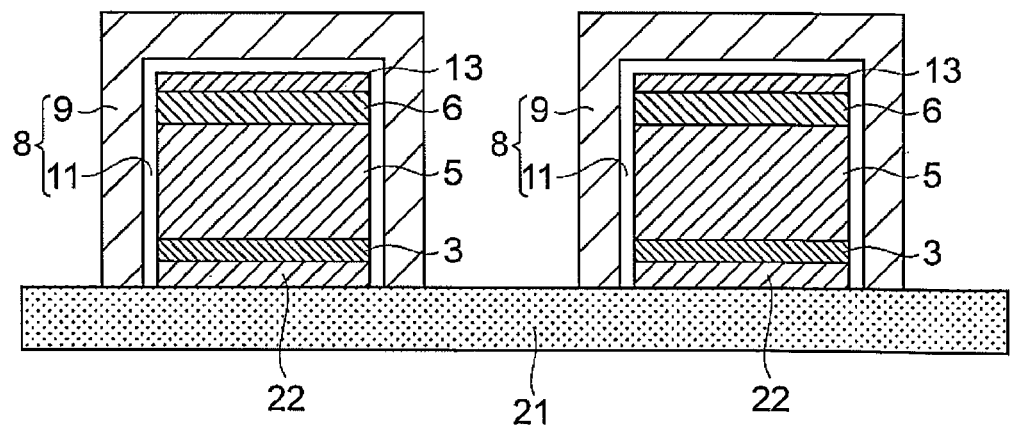
FIG. 4 is a schematic diagram showing a magnified view of the cross-sectional structure of a section of a conductor circuit 50 on which a gold layer 8 has been formed, in a case where a metal layer-forming step has been performed.

FIG. 4 is a schematic diagram showing a magnified view of the cross-sectional structure of a section of a conductor circuit 50 on which a gold layer 8 has been formed, in a case where a metal layer-forming step has been carried out after the nickel layer-forming step and before the resist removal step. As shown in FIG. 4, at this section, a copper foil 22, a copper plating layer 3, a second copper layer 5, a nickel layer 6 and a metal layer 13 are laminated on an insulating layer 21 formed in that order on the surface of an inner board 1 (not shown), and a gold layer 8 comprising a displacement gold plating film 11 and a reductive gold plating film 9 is formed covering the top surface and the sides of the multilayer structure.

When the metal layer-forming step has been carried out after the resist removal step and before the gold layer-forming step, the metal layer 13 is formed on both the top surface and sides of the conductor circuit 50 on which the nickel layer 6 has been formed, since it is after removal of the resist 4.

Figure 5:
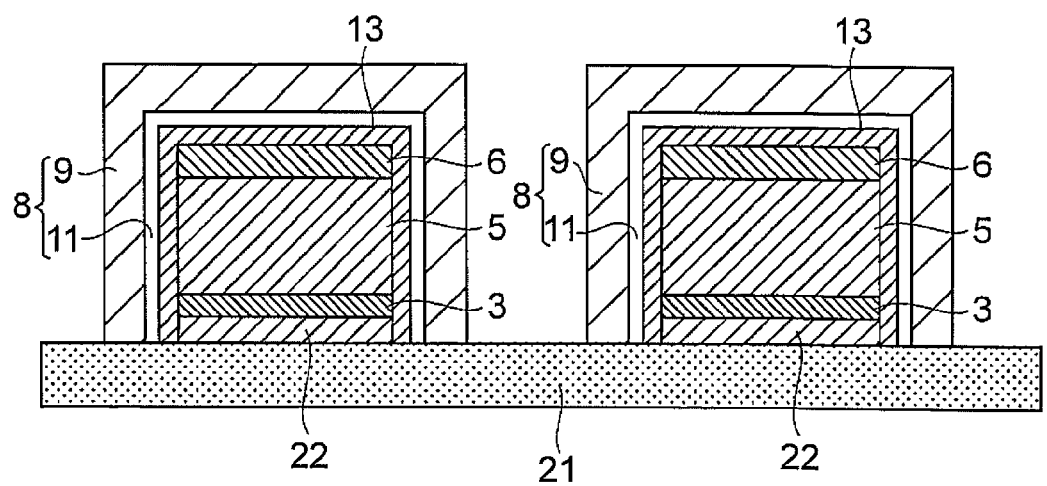
FIG. 5 is a schematic diagram showing a magnified view of the cross-sectional structure of a section of a conductor circuit 50 on which a gold layer 8 has been formed, in a case where a metal layer-forming step has been performed.

FIG. 5 is a schematic diagram showing a magnified view of the cross-sectional structure of a section of a conductor circuit 50 on which a gold layer 8 has been formed, in a case where a metal layer-forming step has been carried out after the resist removal step and before the gold layer-forming step. As shown in FIG. 5, at this section, a copper foil 22, a copper plating layer 3, a second copper layer 5 and a nickel layer 6 are laminated on an insulating layer 21 formed on the surface of an inner board 1 (not shown), and a gold layer 8 comprising a displacement gold plating film 11 and a reductive gold plating film 9 is formed after the metal layer 13 has been formed covering the top surface and the sides of the multilayer structure, in a manner further covering the metal layer 13.

The metal layer 13 comprises one or more metals selected from the group consisting of cobalt, palladium, platinum and gold. If a layer comprising cobalt, palladium or platinum is formed as the metal layer 13, the metal layer 13 will be formed between the nickel layer 6 and gold layer 8, and it will be possible to prevent diffusion of nickel in the nickel layer 6 into the film 8. This will tend to result in satisfactory wire bondability. Palladium is particularly preferred. When palladium is used as the metal layer 13, the stability of the plating solution will be high, resulting in a satisfactory effect of inhibiting diffusion of nickel and allowing the wire bondability to be further increased. When solder connection has been made on the gold layer 8, a trace content of palladium can improve the solder connection reliability.

In cases where the metal layer 13 is formed only on the top surface of the nickel layer 6, as in the example shown in FIG. 4, since no nickel layer 6 is present on the side sections of the conductor circuit 50, the gold layer 8 contacts with the copper composing the conductor circuit 50 at those sections. When heat treatment is carried out for wire bonding or the like in this state, the copper may diffuse into the gold layer 8 and migrate to the surface of the gold layer 8, which can lower the wire bondability at the gold layer 8. In contrast, by forming the metal layer 13 so as to cover both the top surface and sides of the conductor circuit 50 on which the nickel layer 6 has been formed, as in the example shown in FIG. 5, it is possible to effectively inhibit such diffusion of copper and further minimize reduction in the wire bondability.

Also, when gold is used as the metal layer 13, forming the metal layer 13 comprising gold (gold film) before the resist removal step will allow the metal layer 13 to be formed only on the top surface of the nickel layer 6, so as to reduce the thickness of the gold layer 8 formed by electroless gold plating when the gold layer 8 is further formed on the outer surface of the conductor circuit in the gold layer-forming step, as in the example shown in FIG. 4. In this case, it is possible to satisfactorily accomplish electroless gold plating while inhibiting bridging, even when, for example, a reducing agent that generates hydrogen gas is used as the reducing agent of the reductive gold plating solution. Such a gold-containing metal layer 13 (gold film) is preferably formed by an electrolytic plating method. If, after the nickel layer 6 has been formed by electrolytic nickel plating, a gold-containing metal layer 13 is formed by electrolytic gold plating and a gold layer 8 is subsequently formed by electroless gold plating, it will tend to be easier to increase the sizes of the crystal grains of the gold layer 8, than when displacement gold plating is performed after formation of the nickel layer 6 and electroless gold plating is further carried out for direct formation of the gold layer 8. It may therefore be easier to improve the wire bondability. Incidentally, since the insulating reliability is reduced when copper is exposed on the sides of a conductor circuit, the conductor circuit must have its entire surface (top surface and sides) covered with a gold layer at the final stage.

When a metal layer 13 made of palladium (palladium layer) is to be formed, the palladium layer is preferably formed by electroless palladium plating. The electroless palladium plating may be displacement palladium plating or reductive palladium plating using a reducing agent. The method of forming the palladium layer by electroless palladium plating is most preferably a method of reductive palladium plating following displacement palladium plating. This is because direct electroless palladium plating reaction on the nickel layer 6 formed by electrolytic nickel plating tends to be difficult. If palladium is electrolytically replaced by displacement palladium plating beforehand, deposition of a palladium layer by subsequent reductive palladium plating will allow a palladium layer to be satisfactorily formed.

The thickness of the palladium layer is preferably 0.03-0.5 µm, more preferably 0.01-0.3 µm and even more preferably 0.03-0.2 µm. If the palladium layer thickness exceeds 0.5 µm, the effect of forming the palladium layer will not increase accordingly, and this will tend to be uneconomical. A thickness of less than 0.03 µm, on the other hand, will result in more sections without deposition of the palladium layer, and it may not be possible to sufficiently obtain an effect of improved connection reliability by formation of the palladium layer.

There are no particular restrictions on the palladium source of the plating solution to be used for electroless palladium plating, and it may be a palladium compound such as palladium chloride, sodium palladium chloride, ammonium palladium chloride, palladium sulfate, palladium nitrate, palladium acetate or palladium oxide. Specifically, there may be used acidic palladium chloride "$PdCl_2/HCl$", palladium tetramine sulfate "$Pd(NH_3)_4NO_2$", sodium palladium nitrate salt "$Pd(NO_3)_2/H_2SO_4$", dinitrodiaminepalladium "$Pd(NH_3)_2(NO_2)_2$", dicyanodiaminepalladium "$Pd(CN)_2(NH_3)_2$", dichlorotetraminepalladium "$Pd(NH_3)_4Cl_2$", palladium sulfaminate "$Pd(NH_2SO_3)_2$", palladium diamine sulfate "$Pd(NH_3)_2SO_4$", palladium tetramine oxalate "$Pd(NH_3)_4C_2O_4$" and palladium sulfate "$PdSO_4$". There are also no particular restrictions on buffering agents to be added to the plating solution.

The palladium layer formed by the electroless palladium plating has a palladium purity of preferably 90 wt % or greater, more preferably 99 wt % or greater and most preferably nearly 100 wt %. If the palladium purity is less than 90 wt %, deposition onto the nickel layer 6 during formation will be inhibited and the wire bondability and solder connection reliability may be reduced.

If a formic acid compound is used as a reducing agent for electroless palladium plating, the purity of the obtained palladium layer will more easily be 99 wt % or greater, and uniform deposition will be possible. When a phosphorus-containing compound such as hypophosphorous acid or phosphorous acid or a boron-containing compound is used as the reducing agent, the resulting palladium layer will be a palladium-phosphorus alloy or palladium-boron alloy, and therefore in such cases the reducing agent concentration, pH and bath temperature are preferably regulated so that the palladium purity is 90 wt % or greater.

The palladium layer does not necessarily need to be formed by electroless palladium plating, and may be formed by electrolytic palladium plating instead. In this case, there are no particular restrictions on the palladium source of the electrolytic palladium plating solution to be used for the electrolytic palladium plating, and it may be a palladium compound such as palladium chloride, sodium palladium chloride, ammonium palladium chloride, palladium sulfate, palladium nitrate, palladium acetate and palladium oxide. Specific examples include acidic palladium chloride ($PdCl_2/HCl$), palladium tetramine sulfate ($Pd(NH_3)_4NO_2$), sodium palladium nitrate salt ($Pd(NO_3)_2/H_2SO_4$), dinitrodiaminepalladium ($Pd(NH_3)_2(NO_2)_2$), dicyanodiaminepalladium ($Pd(CN)_2(NH_3)_2$), dichlorotetraminepalladium ($Pd(NH_3)_4Cl_2$), palladium sulfaminate ($Pd(NH_2SO_3)_2$), palladium diamine sulfate ($Pd(NH_3)_2SO_4$), palladium tetramine oxalate ($Pd(NH_3)_4C_2O_4$) and palladium sulfate ($PdSO_4$). There are also no particular restrictions on the buffering agent or other components added to the electrolytic palladium plating solution, and any components in known electrolytic palladium plating solutions may be used.

Second Embodiment

Figure 6:
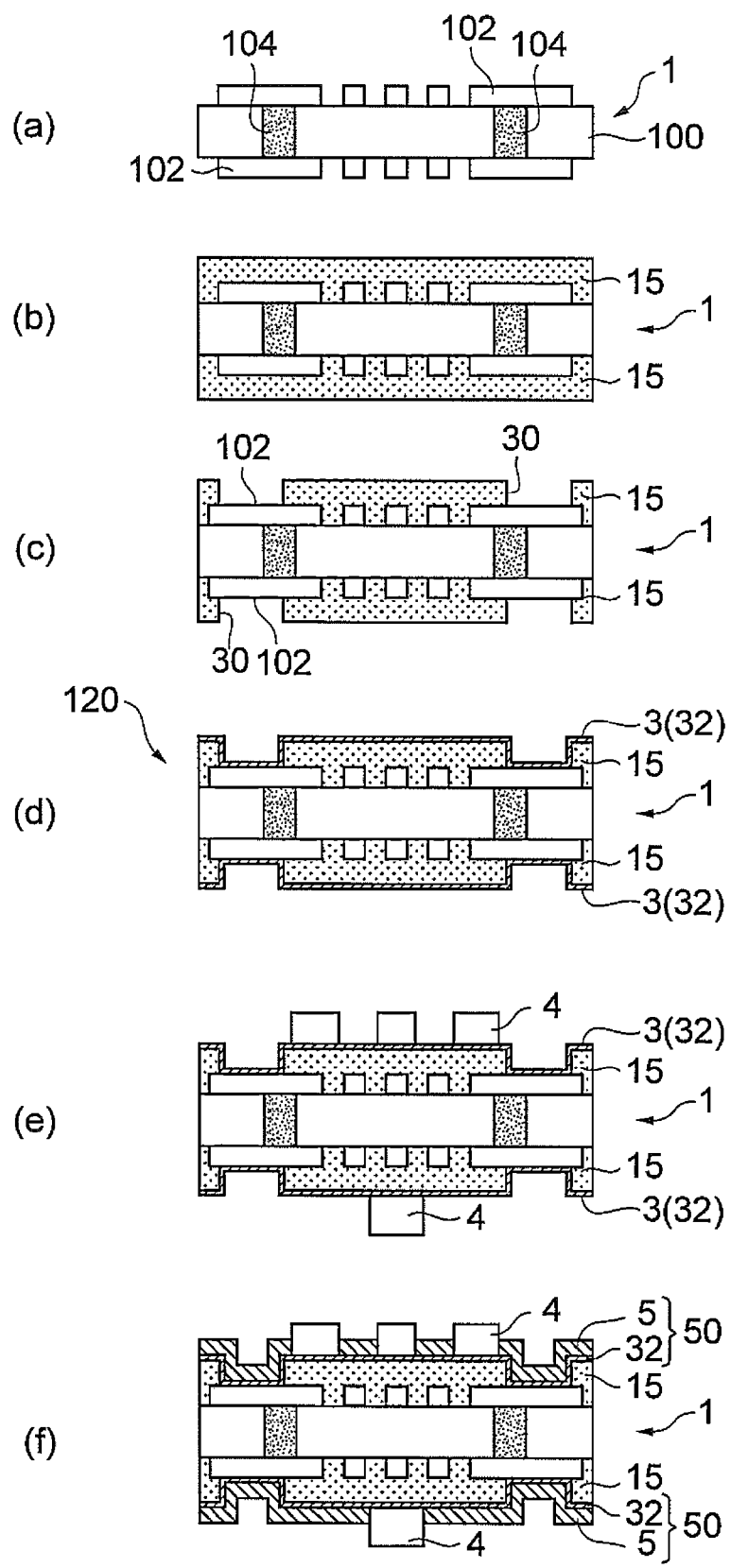
FIG. 6 is a process drawing schematically showing the method for producing a substrate for mounting a semiconductor chip according to a second embodiment.
Figure 7:
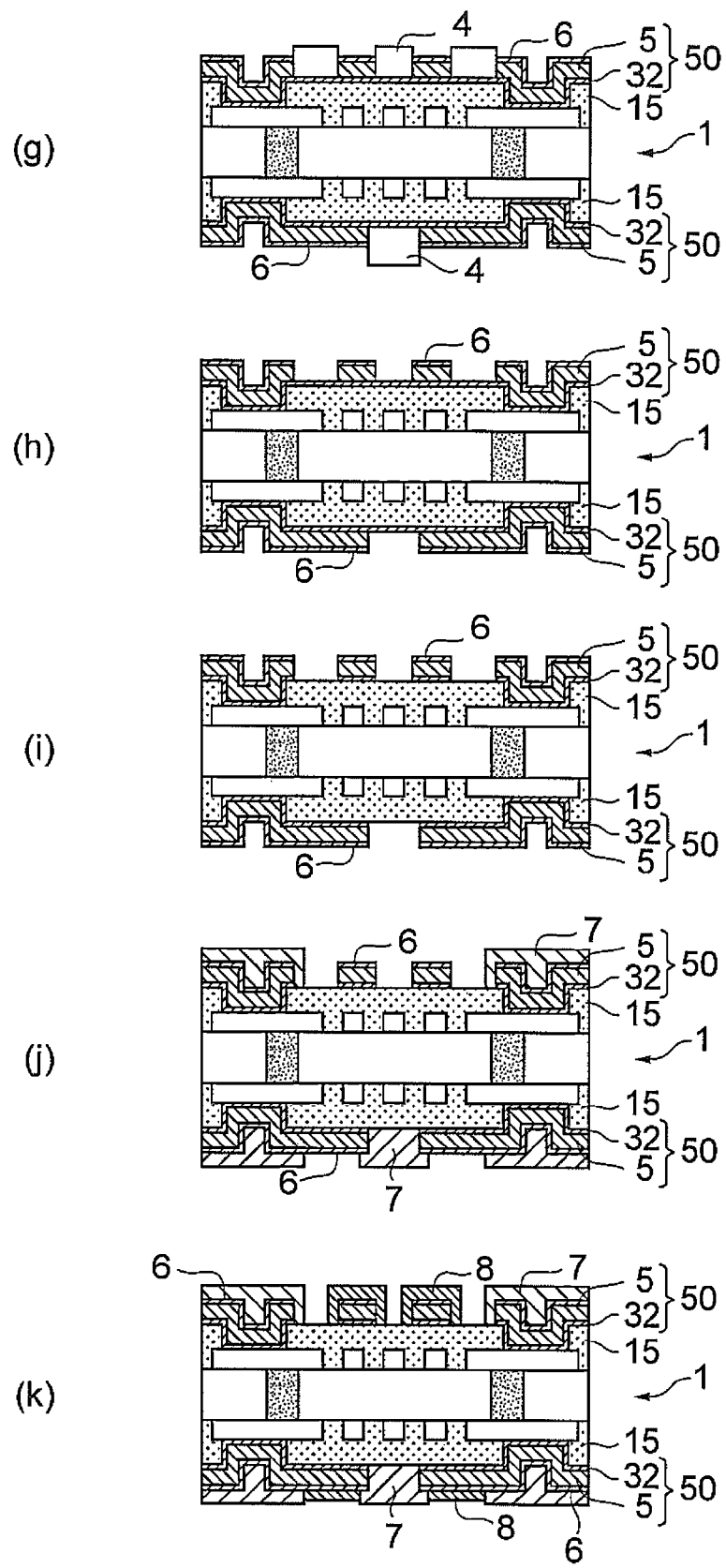
FIG. 7 is a process drawing schematically showing the method for producing a substrate for mounting a semiconductor chip according to a second embodiment.

A preferred second embodiment of a method for producing a substrate for mounting a semiconductor chip will now be explained. FIGS. 6 and 7 are process drawings schematically illustrating the method for producing a substrate for mounting a semiconductor chip according to the second embodiment. This embodiment is an example of a method for producing a substrate for mounting a semiconductor chip by a semi-additive process which comprises a step of forming a copper plating layer after a build-up film has been laminated on an inner board.

According to this embodiment, an inner board 1 is prepared first, as shown in FIG. 6(a). The inner board 1 may be prepared in the same manner as the first embodiment described above. Next, as shown in FIG. 6(b), a build-up film is laminated onto both surfaces of the inner board 1 by lamination or pressing, to form insulating layers 15. The build-up film is a non-conductive film, and comprises an insulating resin material. Such a resin material may be the same type of constituent material as the insulating layer 21 composed mainly of a resin, in the resin-coated conductive foil 2 described above, and it may further contain an inorganic filler, such as a silica filler. The build-up film is in the B-stage state before lamination.

Next, as shown in FIG. 6(c), through-holes (via holes) running through the insulating layer 15 to the inner board 1 are formed at prescribed locations of the insulating layer 15 laminated on the inner board 1, to form interstitial via holes (IVH) 30, thereby exposing portions of the inner layer circuit 102. Formation of these through-holes can also be accomplished in the same manner as formation of the through-holes in the resin-coated copper foil 2 of the first embodiment.

Next, as shown in FIG. 6(d), copper plating layers 3 are formed by electroless copper plating so as to cover the entire surface of the inner board 1 on which the insulating layer 15 has been laminated. This yields a stack 120 comprising the inner board 1, and first copper layers 32 each consisting of only the copper plating layer 3, provided in a manner separated by the insulating layer 15 so as to be connected with portions of the inner layer circuit 102 of the inner board 1. In this stack 120, the copper plating layer 3 is formed in a continuous manner to the interior of the IVH 30, thereby allowing electrical connection between the copper plating layer 3 (first copper layer 32) formed on the surface of the insulating layer 15, and the inner layer circuit 102.

After this type of stack 120 has been formed, a resist-forming step, conductor circuit-forming step, nickel layer-forming step, resist removal step, etching step, solder resist-forming step and gold layer-forming step are carried out in that order in the same manner as the first embodiment.

That is, as shown in FIG. 6(e), a resist 4 is formed as an electrolytic plating resist on the sections on the first copper layer 32 (copper plating layer 3) of the stack 120 other than the sections that are to serve as the conductor circuit (including the IVH 30) (resist-forming step). Next, as shown in FIG. 6(f), a second copper layer 5 is formed on the surface of each first copper layer 32 by electrolytic copper plating, to obtain a conductor circuit 50 in which the first copper layer 32 and second copper layer 5 are laminated (conductor circuit-forming step).

Following this, as shown in FIG. 7(g), a nickel layer 6 is further formed by electrolytic nickel plating on the surface of the second copper layer 5 (nickel layer-forming step), after which, as shown in FIG. 7(h), the resist 4 serving as the electrolytic plating resist is removed (resist removal step). Then, as shown in FIG. 7(i), the first copper layer 32 (copper plating layer 3) on the sections that were covered by the resist 4 are removed by etching (etching step), after which, as shown in FIG. 7(j), a solder resist-forming step is carried out in which a solder resist 7 is formed on the surface so as to expose at least a portion of the conductor circuit 50 on which the nickel layer 6 has been formed.

Then, as shown in FIG. 7(k), a gold layer 8 is formed by electroless gold plating on the sections of the conductor circuit 50 on which the nickel layer 6 has been formed (circuit pattern), over which the solder resist 7 has not been formed (gold layer-forming step). This forms a gold layer 8 covering the top surface and sides of the conductor circuit 50 on which the nickel layer 6 has been formed.

Figure 8:
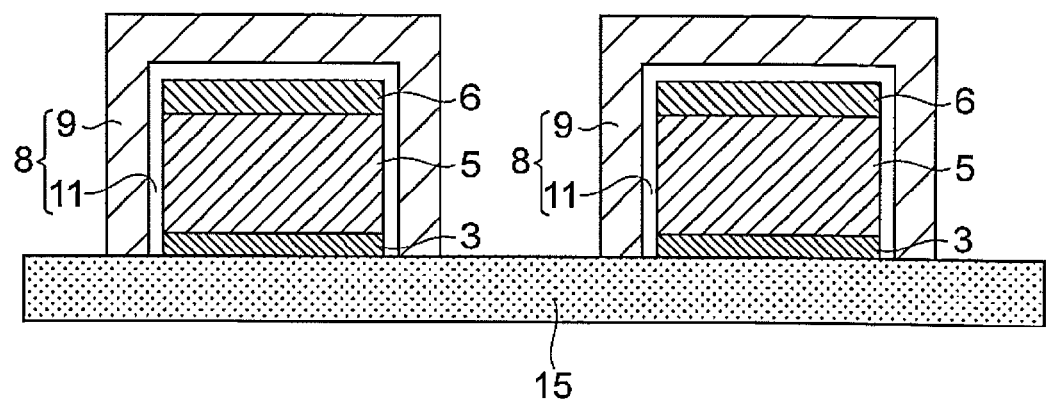
FIG. 8 is a schematic diagram showing a magnified view of the cross-sectional structure of a section of a conductor circuit 50 on which a nickel layer 6 has been formed after formation of a gold layer 8.

FIG. 8 is a schematic diagram showing a magnified view of the cross-sectional structure of a section of a conductor circuit 50 on which a nickel layer 6 has been formed after formation of a gold layer 8. As shown in FIG. 8, at this section, a copper plating layer 3, a second copper layer 5 and a nickel layer 6 are laminated in that order on an insulating layer 15 formed on the surface of an inner board 1 (not shown), and a gold layer 8 comprising a displacement gold plating film 11 and a reductive gold plating film 9 is formed covering the top surface and the sides of the multilayer structure.

In the steps described above, a substrate for mounting a semiconductor chip 10 is obtained having a construction in which conductor circuits 50, as outer layer circuits, are formed on both sides of an inner board 1 separated by insulating layers 15, and a nickel layer 6 and gold layer 8 are formed on the necessary sections of each conductor circuit 50. This type of substrate for mounting a semiconductor chip 10 allows the sections of each conductor circuit 50 on which the nickel layer 6 and gold layer 8 have been formed to function as wire bonding terminals or solder connecting terminals, so that connection with chip parts can be made at those sections.

Preferred embodiments of the invention have been described above, and the production method of the invention as described above can yield a substrate for mounting a semiconductor chip that allows bridging to be reduced and excellent wire bondability and solder connection reliability to be obtained, even when forming fine-pitch wirings. The reasons for this effect are not necessarily fully understood, but the present inventors conjecture as follows.

(Bridging)

First, the reason for a tendency toward bridging in conventional electroless nickel plating is presumably due to the multiple effects of (1) etching residue between wirings, (2) residue of the Pd catalyst for electroless copper plating, remaining between wirings when copper wiring has been formed by electroless copper plating, (3) Pd catalyst residue from displacement Pd plating treatment before electroless nickel plating, and (4) hydrogen gas generated by oxidation of hypophosphorous acid that is commonly used as a reducing agent in electroless plating.

That is, when fine-pitch wiring proceeds and the hydrogen gas concentration between wirings is increased, activity of the electroless nickel plating reaction increases between wirings, thus tending to cause deposition of the electroless nickel plating on the residues of (1)-(3) mentioned above, which is a factor in bridging. In addition, even in the absence of such residues of (1)-(3), increasing hydrogen gas concentration between wirings during electroless nickel plating results in reduction of nickel at those sections and deposition of an alloy layer by direct electroless nickel plating, which also often results in bridging.

Furthermore, the nickel film formed on the sides of wirings by electroless nickel plating tends to be thicker than the electroless nickel plating film on the top surfaces of the wirings, because plating activity is higher at the sides of wirings due to the increased hydrogen gas concentration. This tendency is much more marked with a narrower interconnect distance, and this is also a factor promoting bridging.

The present inventors conjecture the following as the reason for which bridging after electroless nickel plating treatment cannot be inhibited with conventional pretreatment solutions or pretreatment methods designed to inhibit bridging, or with electroless plating catalysts.

Specifically, it is presumed that the conventional pretreatment solutions and pretreatment methods, or electroless plating catalyst solutions, inactivate the aforementioned (1) etching residue or (2) Pd catalyst residue, or reduce the amount of the (3) Pd catalyst residue. However, the aforementioned (4) hydrogen gas is also a cause of bridging, and yet with the conventional pretreatments, pretreatment methods and electroless plating catalyst solutions mentioned above, the hydrogen gas is adsorbed onto the resin surface between wirings, which prevents the effect of inhibiting direct deposition of an alloy layer by electroless nickel plating, thus making it impossible to adequately inhibit bridging, it is believed.

Normally, virtually no bridging occurs even when electroless gold plating is performed on a copper circuit. Hypophosphorous acid is commonly used as the reducing agent for electroless nickel plating, but since hydrogen gas is generated as it oxidizes, this increases activation of the plating solution near the wiring, tending to result in etching residue or electroless copper plating Pd catalyst residue, or direct deposition of nickel.

With electroless gold plating, on the other hand, compounds that generate hydrogen gas by oxidation, such as hypophosphorous acid, are seldom used as reducing agents, with ascorbic acids, urea-based compounds and phenyl-based compounds being most commonly used instead, and therefore, presumably, virtually no hydrogen gas is generated during electroless gold plating, such that bridging does not occur.

In addition, since an electroless nickel plating solution is used at high temperatures of 80-95° C., the deposition rate is high at 0.2-0.3 μm/min, for example, whereas an electroless gold plating solution is used at temperatures of about 60-80° C., and therefore the deposition rate is 0.005-0.03 μm/min and activation is low even if hydrogen gas has been generated. This difference in activation due to differences in deposition rate is also believed to be a factor governing whether or not bridging occurs.

In contrast, according to the invention, electrolytic nickel plating is performed with a resist present on a conductor circuit made of copper, and the resist is removed before electroless gold plating. That is, since electrolytic nickel plating is performed on a conductor circuit, it is difficult for any of the aforementioned factors (1) to (4) to produce bridging. Furthermore, since the resist is present on the sections other than the conductor circuit, this also drastically reduces bridging.

(Solder Connection Reliability)

When electroless nickel/electroless gold plating is performed on a copper circuit in the conventional manner, the electroless nickel plating layer is dissolved by displacement gold plating reaction and can result in formation of a brittle layer, as mentioned in Non-patent document 2 mentioned above. It is believed that this brittle layer is formed because commonly employed electroless nickel is an electroless nickel-phosphorous alloy plating, and the nickel alone tends to elute out in the subsequent displacement gold plating reaction, such that the phosphorus remains as it is concentrated and dissolves. Formation of such a brittle layer results in reduced solder connection reliability.

In contrast, electrolytic nickel plating/electroless gold plating performed on a conductor circuit, as with the present invention, allows pure nickel to be deposited with electrolytic nickel, and therefore the brittle layer seen with electroless nickel-phosphorus alloy plating is not produced by simple elution of nickel in the subsequent displacement gold plating reaction. Presumably for this reason, very high solder connection reliability can be obtained by the electrolytic nickel/electroless gold plating of the invention.

(Wire Bondability)

In the case of conventional electroless nickel/electroless gold plating, the wire bondability is notably reduced with heat treatment, as explained in Non-patent document 2. The reason for this reduction in wire bondability is believed to be that nickel diffuses from the electroless nickel film at the grain boundaries of the gold plating film, whereby nickel oxides form on the surface of the gold plating film as nickel migrates into the surface. The nickel oxides produced in this manner interfere with bonding between the gold wire and gold plating film, thus tending to lower the wire bondability.

According to the invention, however, electrolytic nickel/electroless gold plating is performed on the conductor circuit, and therefore with electrolytic nickel it is possible to form a nickel layer with an average nickel crystal grain size of 0.25 μm or greater on the surface opposite the conductor circuit, thereby resulting in more excellent wire bondability compared to conventional electroless nickel/electroless gold plating. The reason for this is believed to be that the nickel particle size in an electrolytic nickel film differs from the particle size in an electroless nickel film.

Specifically, commonly employed electroless nickel is an electroless nickel-phosphorus alloy plating, as mentioned above, and an amorphous film is formed, whereas the film formed by electrolytic nickel is crystalline and therefore the electrolytic nickel film has larger nickel crystal grains than an electroless nickel film. In addition, while brightening agents are commonly added to electrolytic nickel plating solutions, the electrolytic nickel plating solution of the invention contains little or no brightening agent, and this also allows large growth of the nickel crystal grains.

The brightening agents in electrolytic nickel plating solutions include 2 types, primary brightening agents and secondary brightening agents, the primary brightening agents functioning to impart brightness by micronization of the crystals in the film, and the secondary brightening agents functioning to fill microdefects that cannot be filled with primary brightening agents, thus producing a leveling effect. Known primary brightening agents include aromatic sulfonic acids (benzenesulfonic acid and the like), aromatic sulfonamides (p-toluenesulfonamide and the like) and aromatic sulfonimides (saccharin and the like), while known secondary brightening agents include aldehydes (formaldehyde and the like), allyl and vinyl compounds (allylsulfonic acids and the like), acetylene compounds (2-butyl-1,4-thiol and the like), and nitriles (ethyl cyanohydrin and the like). A primary brightening agent alone is usually added to an electrolytic nickel plating solution.

When an electroless gold plating film is to be deposited on an electrolytic nickel plating film, the electroless gold plating film grows by epitaxial growth, and therefore a larger nickel crystal grain size results in larger gold crystal grains, and after electrolytic nickel plating the resulting gold crystal grains can have approximately the same size as with electrolytic gold plating. Consequently, even with heat treatment of wire bonding terminals and the like formed in this manner, the gold layer has a high effect of inhibiting diffusion of nickel, and therefore excellent wire bondability can be exhibited.

For electroless gold plating or electrolytic gold plating on electrolytic nickel plating with the same particle size, a slightly smaller gold particle size tends to result with electroless gold plating. According to the invention, however, an electrolytic nickel plating solution is used with either minimal additives or no additives in the electrolytic nickel plating solution, and therefore the nickel particle size in the electrolytic nickel film can be increased. Thus, forming a gold layer 8 by electroless gold plating after forming the nickel layer 6 by electrolytic nickel plating, according to the invention, allows fine-pitch wiring to be achieved, while also maintaining a large gold particle size in the gold layer 8, so that high wire bondability can be obtained.

Preferred embodiments of the substrate for mounting a semiconductor chip and the method for producing it according to the invention were explained above, but the invention is not necessarily limited to these embodiments, and various modifications may be implemented such as are within the gist of the invention.

For example, a nickel layer 6 was formed by electrolytic nickel plating on the entire region of the second copper layer 3 (conductor circuit) in the embodiment described above, but the nickel layer 6 may instead by partially formed on prescribed locations of the second copper layer 3. Specifically, after the second copper layer 3 has been formed, a resist (upper resist) may be formed on the copper layer 3 at the sections other than those on which the nickel layer 6 is to be formed, and the nickel layer 6 may be formed in the nickel layer-forming step only on the sections of the second copper layer 3 on which the upper resist has not been formed. In this case, the regions on the conductor circuit (second copper layer 3) other than the solder connecting terminals or wire bonding terminals will not be covered by the nickel layer 6, and will be directly bonded with the solder resist 7 to be formed thereover. In addition, since the solder resist 7 will usually have higher adhesiveness with copper than with nickel, this construction increases the adhesiveness with the solder resist 7 and can further improve the reliability.

Moreover, the embodiment described above was described as an example of forming an outer layer conductor circuit on both surfaces of the inner board, but there is no limitation to this mode, and for example, the outer layer conductor circuit may be formed only on one surface side of the inner board. In addition, the obtained substrate for mounting a semiconductor chip may be further used as an inner board and the same steps repeated to obtain a multilayer board comprising an external conductor circuit with multiple layers.

EXAMPLES

Example 1

Production of Substrate for Mounting a Semiconductor Chip (1a) Preparation of Inner Board First, as shown in FIG. 1(a), an MCL-E-679 (trade name of Hitachi Chemical Co., Ltd.) was prepared as a 0.2 mm-thick glass cloth base material/epoxy copper-clad laminate, having a 18 μm-thick copper foil laminated on both sides of an insulating base material, and the unwanted sections of the copper foil were removed by etching and through-holes were formed, to obtain an inner board with an inner layer circuit formed on the surface (inner board 1).

(1b) Lamination of Resin-Coated Copper Foil

As shown in FIG. 1(b), MCF-7000LX (trade name of Hitachi Chemical Co., Ltd.) comprising a 3 μm-thick copper foil 22 coated with an adhesive (insulating layer 21) was laminated onto both sides of the inner board by hot pressure for 60 minutes under conditions of 170° C., 30 kgf/cm$^2$.

(1c) Formation of IVH

As shown in FIG. 1(c), an L-500 Carbon dioxide gas impact laser punching machine (trade name of Sumitomo Heavy Industries, Ltd.) was used to form IVH 30 as 80 μm-diameter non-penetrating holes on the copper foil 22. The IVH 30-formed substrate was dipped in a mixed aqueous solution comprising 65 g/L potassium permanganate and 40 g/L sodium hydroxide at a liquid temperature of 70° C. for 20 minutes, to remove the smearing inside the holes.

(1d) Electroless Copper Plating

As shown in FIG. 1(d), the substrate obtained after step (1c) was dipped in the palladium solution HS-202B (trade name of Hitachi Chemical Co., Ltd.) at 25° C. for 15 minutes to impart a catalyst to the surface of the copper foil 22. Next, CUST-201 (trade name of Hitachi Chemical Co., Ltd.) was used for electroless copper plating under conditions of 25° C. liquid temperature, 30 minutes. This formed an electroless copper plating layer (copper plating layer 3) with a thickness of 0.3 μm on the surface, over the copper foil 21 and in the IVH 30.

(1e) Formation of Electrolytic Plating Resist

As shown in FIG. 1(e), the dry film photoresist RY-3025 (trade name of Hitachi Chemical Co., Ltd.) was laminated on the surface of the electroless copper plating layer, and the photoresist was exposed to ultraviolet rays through a photomask masking the sections for electrolytic copper plating, after which it was developed to form an electrolytic plating resist (resist 4).

(1f) Electrolytic Copper Plating

As shown in FIG. 1(f), a copper sulfate bath was used under conditions of 25° C. liquid temperature, 1.0 A/dm$^2$ current density for electrolytic copper plating to a thickness of about 20 μm on the copper plating layer 3, to form a second copper layer 5 having a pattern form with circuit conductor width/circuit conductor spacing (L/S)=35/35 μm. On the side opposite the side on which the pattern was formed, an electrolytic copper plating film (second copper layer 5) was formed, so as to form pads with 600 μm land diameters for solder ball connection.

(1g) Electrolytic Nickel Plating

As shown in FIG. 2(g), an electrolytic nickel plating solution with the following composition, containing no brightening agent, was used under conditions of 55° C. liquid temperature, 1.5 A/dm$^2$ current density, so as to obtain an approximately 3 μm-thick electrolytic nickel plating on the electrolytic copper plating layer, to form an electrolytic nickel film (nickel layer 6).

Composition of electrolytic nickel plating solution (Watt bath)

Nickel sulfate: 240 g/L
Nickel chloride: 45 g/L
Boric acid: 30 g/L
Surfactant: 3 ml/L
(Trade name: Anti-Pit Agent #62, Japan Pure Chemical Co., Ltd.)
pH: 4

(1h) Release of Electrolytic Plating Resist

As shown in FIG. 2(h), the resist release solution HTO (trade name of Nichigo-Morton Co., Ltd.) was used to remove the electrolytic plating resist.

(1i) Etching

As shown in FIG. 2(i), an etching solution having a composition of 20 g/L sulfuric acid and 10 g/L hydrogen peroxide, as the major components, was used to remove the copper on the sections covered by the electrolytic plating resist (copper foil 21 and copper plating layer 3), by etching (1j) Formation of Solder Resist As shown in FIG. 2(*j*), the photosensitive solder resist "PSR-4000 AUS5" (trade name of Taiyo Ink Manufacturing Co., Ltd.) was coated onto the upper surface of the etched substrate using a roll coater, to a post-curing thickness of 40 µm. This was followed by exposure and development to form a solder resist 7 with openings at prescribed locations on the conductor circuit. On the lower surface, a solder resist 7 with 500 µm opening diameters was formed on copper pads with land diameters of 600 µm, for formation of pads for solder ball connection.

(1k) Electroless Gold Plating

As shown in FIG. 2(*k*), the substrate on which the solder resist 7 was formed was dipped in the displacement gold plating solution HGS-100 (trade name of Hitachi Chemical Co., Ltd.) at 85° C. for 2 minutes, and then rinsed with water for 1 minute. It was then dipped in the reductive gold plating solution HGS-2000 (trade name of Hitachi Chemical Co., Ltd.) at 70° C. for 45 minutes and further rinsed with water for 5 minutes, to form an electroless gold plating film (gold layer 8). The total film thickness of the electroless gold plating film obtained by displacement gold plating and reductive gold plating was 0.5 µm. For this example and the examples and comparative examples described below, the film thicknesses of the nickel layer, palladium layer and gold layer were measured using an SFT9500 fluorescent X-ray film thickness meter (trade name of SII NanoTechnology Inc.).

This yielded a substrate for mounting a semiconductor chip having terminal sections covered on the upper and lower surfaces with a gold layer 8, as shown in FIG. 2(*k*). In this substrate for mounting a semiconductor chip, the upper terminal sections correspond to the terminals for wire bonding connection, while the lower terminal sections correspond to the terminals for solder connection. The substrate for mounting a semiconductor chip has 1000 of each of these terminals (likewise for the following examples and comparative examples).

(Evaluation of Properties)

(1) Fine-Pitch Wiring Formability

The fine-pitch wiring formability of the substrate for mounting a semiconductor chip obtained as described above, after electroless gold plating, was evaluated based on the following scale. The results are shown in Table 1.

A: No bridging, satisfactory plating film formation on terminal sections, circuit conductor spacing of 25 µm or greater.
B: Partial runover and deposition of plating on outer periphery of terminal sections, circuit conductor spacing of 20 µm or greater and less than 25 µm.
C: Partial runover and deposition of plating on outer periphery of terminal sections, circuit conductor spacing of 15 µm or greater and less than 20 µm.
D: Partial runover and deposition of plating on outer periphery of terminal sections, circuit conductor spacing of 5 µm or greater and less than 15 µm.
E: Partial runover and deposition of plating on outer periphery of terminal sections, circuit conductor spacing of less than 5 µm.

(2) Wire Bondability

The wire bondability (wire bonding connectivity) of the connecting terminals in the obtained substrate for mounting a semiconductor chip was evaluated based on the following scale.

Specifically, a plurality of substrates for mounting semiconductor chips, corresponding to Example 1, were subjected to heat treatment at 3, 10, 50, 100 and 200 hours at 150° C., and wire bonding was performed after elapse of each heat treatment time. Wire bonding was performed at all of 1000 terminals for wire bonding connection, using gold wires with wire diameters of 28 µm. The wire bonding apparatus used was a UTC200-Super2 (trade name of Shinkawa, Ltd.), under conditions of bonding temperature (heat block temperature): 165° C., bonding load: 70 gf, ultrasonic output: 90PLS, ultrasonic time: 25 ms.

Following the wire bonding, a bond tester (trade name: BT2400PC by Dage Co.) was used for a gold wire pull test in which the gold wires were pulled and the strength to separation from the terminals was measured, and the wire bonding connection reliability for each terminal was evaluated based on the following scale. The obtained results are shown in Table 1.

A: Average value of wire pull strength: ≥10 g
B: Average value of wire pull strength: ≥8 g and <10 g.
C: Average value of wire pull strength: ≥3 g and <8 g.
D: Average value of wire pull strength: <3 g (3) Solder Connection Reliability The connecting terminal solder connection reliability for the obtained substrate for mounting a semiconductor chip was evaluated based on the following scale.

Specifically, ϕ0.76 mm Sn-3.0Ag-0.5Cu solder balls were connected to 1000 solder connecting terminals on the substrate for mounting a semiconductor chip using a reflow furnace (peak temperature: 252° C.), and then a 4000HS Impact Resistance High Speed Bond Tester (trade name of Dage, Ltd.) was used for a solder ball shear test under conditions of approximately 200 mm/sec (standing time 0 h). Also, several substrates for mounting semiconductor chips were prepared having solder balls connected by reflow, and after standing at 150° C. for 100, 300 and 1000 hours, these were also subjected to a solder ball shear test in the same manner.

The evaluation scale for the solder connection reliability was as shown below, and evaluation was made for each terminal on this scale. The obtained results are shown in Table 1.

A: Damage due to shear observed in the solder balls of the solder connecting terminals at all 1000 locations.
B: Damage other than damage due to shear observed in the solder balls at 1-10 locations.
C: Damage other than damage due to shear observed in the solder balls at 11-100 locations.
D: Damage other than damage due to shear observed in the solder balls at 101 or more locations.

(4) Diffusion of Nickel into Gold Layer Surface

The following test was conducted to examine the state of diffusion of nickel into the gold layer 8 at the terminal sections of the substrate for mounting a semiconductor chip. Specifically, several substrates for mounting semiconductor chips were subjected to heat treatment at 150° C. for 50, 100 and 200 hours, and then an AXIS 165 X-ray photoelectron spectrometer (trade name of Shimadzu Corp.) was used for elemental analysis of the gold layer surface, to determine the type of elements present in the gold layer surface and their proportions. The obtained results are shown in Table 2.

(5) Crystal Grain Sizes of Nickel Layer/Gold Layer

Figure 9:
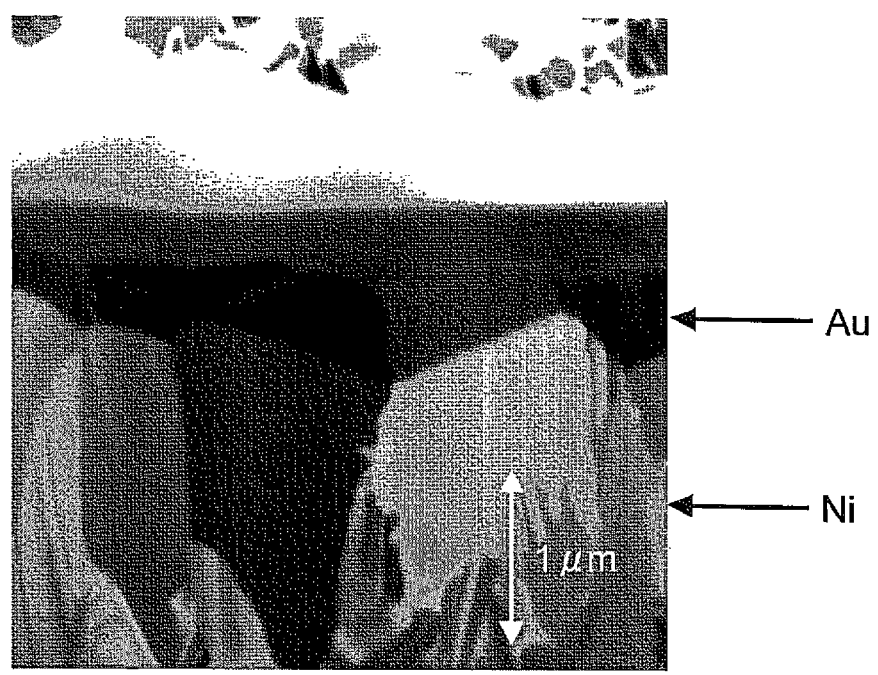
FIG. 9 is a photograph showing the results of observation of the nickel layer 6/gold layer 8 of Example 1, by FIB/SIM.

In order to examine the crystal grain sizes of nickel and gold in the nickel layer 6 and gold layer 8 at the terminal sections, the terminal sections were machined using a Focused Ion Beam System (FIB, Model FB-2000A by Hitachi, Ltd.), and observed using the scanning ion microscope (SIM) installed in the FIB (hereunder referred to as FIB/SIM). The obtained results are shown in FIG. 9. In FIG. 9, Au represents the gold layer and Ni represents the nickel layer (same for FIGS. 10-14).

In addition, the nickel layer 6 adjacent to the gold layer 8 was measured by Electron Backscatter Diffraction (EBSD) to determine the mean particle size. The SEM apparatus used was an SU6600 (trade name of Hitachi, Ltd.), and the EBSP measurement/analysis system used was an OIM (Orientation Imaging Macrograph, analysis software: "OIMAnalysis") (trade name of TSL). The mean particle size was measured in a 15 μm width of the cross-section of the nickel layer 6 adjacent to the gold layer 8, and the cross-sectional area of each crystal grain was calculated, the average determined, and the circle-equivalent diameter was recorded as the mean particle size. The center section of a 35 μm circuit conductor width was observed by EBSD. Table 3 shows the average values for the crystal grain size for nickel on the surface of the nickel layer 6 on the gold layer 8 side, obtained by this observation.

(6) Adhesion of Solder Resist

The adhesion between the conductor circuit and solder resist was evaluated by a PCT (Pressure Cooker Test). Specifically, in step (1j) described above, a solder resist 7 without openings was formed so as to cover the entire conductor circuit on which were formed 1000 μads for solder ball connection, each with a land diameter of 600 μm, for use as a test sample. The test sample was subjected to moisture absorption (PCT) treatment for 96 hours under conditions of 121° C./100% RH/2.3 atm. Following the treatment, it was visually observed whether or not blisters had formed on the tops of the solder ball connection pads, and the adhesion of the solder resist on the conductor circuit was evaluated. The obtained results are shown in Table 1. The evaluation results in the table are based on the following scale.

A: No blistering
B: Blistering at 1-30 locations
C: Blistering at 31-100 locations
D: Blistering at 100 or more locations Example 2

Production of Substrate for Mounting a Semiconductor Chip

After carrying out steps (1a)-(1g) in Example 1, the nickel layer 6-formed substrate was dipped in the displacement palladium plating solution SA-100 (trade name of Hitachi Chemical Co., Ltd.) at a liquid temperature of 25° C. for 2 minutes, rinsed with water for 1 minute, and further dipped into the reductive palladium plating solution PALET (trade name of Kojima Chemicals Co., Ltd.) at 70° C. for 1 minute, to deposit a 0.1 μm reductive palladium plating film (palladium layer). Next, following steps (1h)-(1j) in Example 1, step (1k) was carried out in the same manner except for dipping the displacement gold plating from those steps in HGS-100 (trade name of Hitachi Chemical Co., Ltd.) at 85° C. for 10 minutes, to obtain a substrate for mounting a semiconductor chip.

(Evaluation of Properties)

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold layer surface was also evaluated in the same manner as Example 1. The obtained results are shown in Table 2.

Example 3

Production of Substrate for Mounting a Semiconductor Chip

Following steps (1a)-(1g) in Example 1, the electrolytic palladium plating solution PARABRITE SST-L (trade name of Japan Pure Chemical Co., Ltd.) was used for electrolytic palladium plating on the surface of the nickel layer 6 at 60° C., 1 A/dm$^2$ for 40 seconds, to deposit a 0.2 μm-thick palladium plating film (palladium layer). Next, following steps (1h)-(1j) in Example 1, step (1k) was carried out in the same manner except for dipping the displacement gold plating from those steps in HGS-100 (trade name of Hitachi Chemical Co., Ltd.) at 85° C. for 10 minutes, to obtain a substrate for mounting a semiconductor chip.

(Evaluation of Properties)

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold layer surface was also evaluated in the same manner as Example 1. The obtained results are shown in Table 2.

Example 4

Production of Substrate for Mounting a Semiconductor Chip

Following steps (1a)-(1g) in Example 1, the strike electrolytic gold plating solution ACID STRIKE (trade name of Japan Pure Chemical Co., Ltd.) was used for strike electrolytic gold plating on the surface of the nickel layer 6 at 40° C., 2 A/dm$^2$ for 20 seconds. Steps (1h)-(1j) of Example 1 were then carried out in the same manner. Next, the solder resist 7-formed substrate was dipped in the reductive gold plating solution HGS-2000 (trade name of Hitachi Chemical Co., Ltd.) at 70° C. for 45 minutes and rinsed with water for 5 minutes, to additionally form a gold layer over the gold layer formed by the strike electrolytic gold plating. This yielded a substrate for mounting a semiconductor chip. The total film thickness of the gold layers formed by strike electrolytic gold plating and reductive gold plating was 0.5 μm.

(Evaluation of Properties)

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold layer surface was also evaluated in the same manner as Example 1. The obtained results are shown in Table 2.

Example 5

Production of Substrate for Mounting a Semiconductor Chip

Following steps (1a)-(1g) in Example 1, the electrolytic palladium plating solution PARABRITE SST-L (trade name of Japan Pure Chemical Co., Ltd.) was used for electrolytic palladium plating on the surface of the nickel layer 6 at 60° C., 1 A/dm$^2$ for 40 seconds, to deposit a 0.2 μm-thick palladium plating film (palladium layer). Next, the strike electrolytic gold plating solution ACID STRIKE (trade name of Japan Pure Chemical Co., Ltd.) was used for strike electrolytic gold plating on the surface of the palladium plating film at 40° C., 2 A/dm² for 20 seconds. Steps (1h)-(1j) of Example 1 were then carried out. Next, the solder resist 7-formed substrate was dipped in the reductive gold plating solution HGS-2000 (trade name of Hitachi Chemical Co., Ltd.) at 70° C. for 45 minutes and rinsed with water for 5 minutes, to additionally form a gold layer over the gold layer formed by the strike electrolytic gold plating. This yielded a substrate for mounting a semiconductor chip. The total film thickness of the gold layers formed by strike electrolytic gold plating and reductive gold plating was 0.5 μm.

(Evaluation of Properties)

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold layer surface was also evaluated in the same manner as Example 1. The results are shown in Table 2.

Example 6

Production of Substrate for Mounting a Semiconductor Chip

After carrying out steps (1a)-(1j) in Example 1, a step was carried out in which the solder resist 7-formed substrate was dipped in the displacement palladium plating solution SA-100 (trade name of Hitachi Chemical Co., Ltd.) at a liquid temperature of 25° C. for 2 minutes and then rinsed with water for 1 minute, and further dipped into the reductive palladium plating solution PALET (trade name of Kojima Chemicals Co., Ltd.) at 70° C. for 1 minute, to deposit a 0.1 μm reductive palladium plating film, thereby forming a palladium layer on the nickel layer 6. Next, step (1k) was carried out in the same manner except for dipping the displacement gold plating from those steps in HGS-100 (trade name of Hitachi Chemical Co., Ltd.) at 85° C. for 10 minutes, to obtain a substrate for mounting a semiconductor chip.

(Evaluation of Properties)

The obtained substrate for mounting a semiconductor chip was used for evaluation of the fine-pitch wiring formability, wire bondability, solder connection reliability and solder resist adhesion, in the same manner as Example 1. The results are shown in Table 1. The state of nickel diffusion into the gold layer surface was also evaluated in the same manner as Example 1. The results are shown in Table 2.

Example 7

Production of Substrate for Mounting a Semiconductor Chip

A substrate for mounting a semiconductor chip was obtained in the same manner as Example 1, except that in step (1g), an electrolytic nickel plating solution with the following composition, containing a brightening agent (primary brightening agent), was used under conditions of 55° C. liquid temperature, 1.5 A/dm² current density, so as to obtain an approximately 3 μm-thick electrolytic nickel plating on the second copper layer 5, to form a nickel layer 6 on the second copper layer 5.
Composition of electrolytic nickel plating solution
Nickel sulfate: 240 g/L
Nickel chloride: 45 g/L
Boric acid: 30 g/L
Surfactant: 3 ml/L
(Trade name: Anti-Pit Agent #62, Japan Pure Chemical Co., Ltd.)
Saccharin (brightening agent): 0.1 g/L
pH: 4

(Evaluation of Properties)

Figure 10:
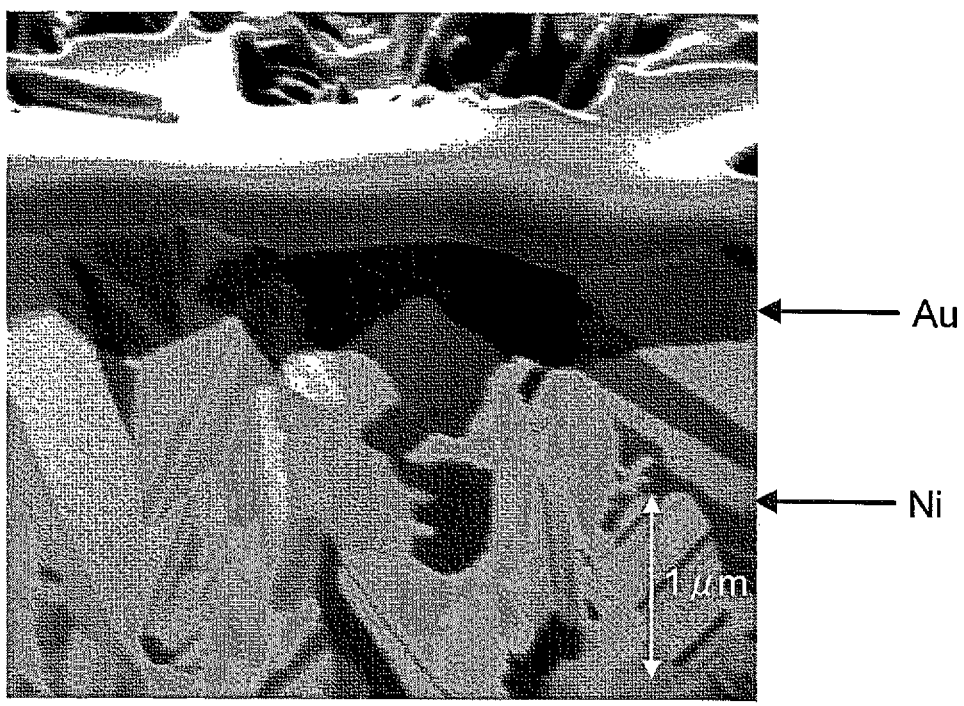
FIG. 10 is a photograph showing the results of observation of the nickel layer 6/gold layer 8 of Example 7, by FIB/SIM.

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold film surface was also evaluated in the same manner as Example 1. The results are shown in Table 2. The crystal grain sizes of nickel and gold in the nickel layer 6 and gold layer 8 were also observed using an FIB/SIM in the same manner as Example 1. The obtained results are shown in FIG. 10. The crystal grain size on the surface of the nickel layer 6 contacting with the gold layer 8 was also measured by EBSD, in the same manner as Example 1. The obtained results are shown in Table 3.

Example 8

Production of Substrate for Mounting a Semiconductor Chip

A substrate for mounting a semiconductor chip was obtained in the same manner as Example 1, except that in step (1g), an electrolytic nickel plating solution with the following composition, containing a brightening agent (primary brightening agent), was used under conditions of 55° C. liquid temperature, 1.5 A/dm² current density, so as to obtain an approximately 3 μm-thick electrolytic nickel plating on the second copper layer 5, to form a nickel layer 6 on the second copper layer 5.
Composition of electrolytic nickel plating solution
Nickel sulfate: 240 g/L
Nickel chloride: 45 g/L
Boric acid: 30 g/L
Surfactant: 3 ml/L
(Trade name: Anti-Pit Agent #62, Japan Pure Chemical Co., Ltd.)
Saccharin (brightening agent): 0.3 g/L
pH: 4

(Evaluation of Properties)

Figure 11:
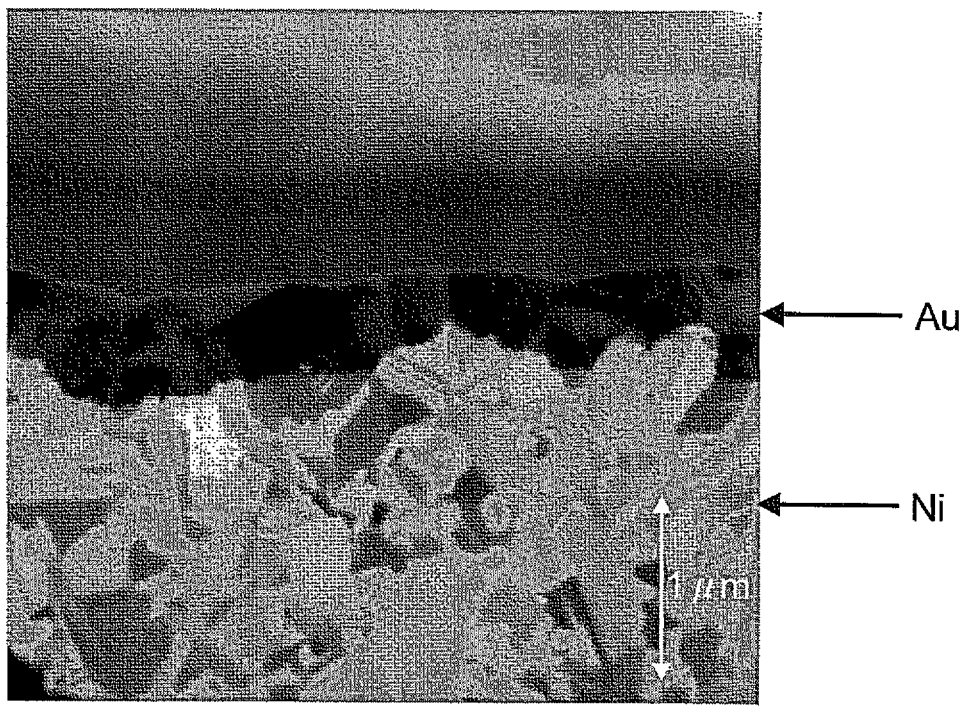
FIG. 11 is a photograph showing the results of observation of the nickel layer 6/gold layer 8 of Example 8, by FIB/SIM.

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold film surface was evaluated in the same manner as Example 1. The obtained results are shown in Table 2. The crystal grain sizes of nickel and gold in the nickel layer 6 and gold layer 8 were also observed by FIB/SIM in the same manner as Example 1. The obtained results are shown in FIG. 11. The crystal grain size on the surface of the nickel layer 6 contacting with the gold layer 8 was also measured by EBSD, in the same manner as Example 1. The obtained results are shown in Table 3.

Example 9

Production of Substrate for Mounting a Semiconductor Chip (2a) Preparation of Inner Board As shown in FIG. 6(a), an MCL-E-679 (trade name of Hitachi Chemical Co., Ltd.) was used as a 0.2 mm-thick glass cloth base material/epoxy copper-clad laminate, having an 18 μm-thick copper foil laminated on both sides of an insulating base material, and the unwanted sections of the copper foil were removed by etching and through-holes were formed, to prepare an inner board 1 with an inner layer circuit formed thereon.

(2b) Lamination of Build-Up Film

As shown in FIG. 6(b), an ABF-45H thermosetting insulating resin film (trade name of Ajinomoto Fine-Techno) was laminated onto both sides of the inner board 1 by hot pressing for 60 minutes under conditions of 170° C., 30 kgf/cm$^2$, to form a build-up film 15.

(2c) Formation of IVH

As shown in FIG. 6(c), IVH 30, as 80 μm-diameter non-penetrating holes, were opened in the build-up film 15 by an L-500 carbon dioxide gas impact laser punching machine (trade name of Sumitomo Heavy Industries, Ltd.). The IVH 30-formed substrate was dipped in a mixed aqueous solution comprising 65 g/L potassium permanganate and 40 g/L sodium hydroxide at a liquid temperature of 70° C. for 20 minutes, to remove the smearing inside the holes.

(2d) Electroless Copper Plating

As shown in FIG. 6(d), the substrate obtained after step (2c) was dipped into the palladium solution HS-202B (trade name of Hitachi Chemical Co., Ltd.) at 25° C. for 15 minutes to impart a catalyst to the surface of the build-up film 15 and the interior surfaces of the IVH 30, and then a CUST-201 (trade name of Hitachi Chemical Co., Ltd.) was used for electroless copper plating under conditions of liquid temperature 25° C., 30 minutes. This formed a copper plating layer 3 with a thickness of 0.3 μm on the surfaces of the build-up film 15 and the IVH 30.

(2e) Formation of Electrolytic Plating Resist

As shown in FIG. 6(e), the dry film photoresist RY-3025 (trade name of Hitachi Chemical Co., Ltd.) was laminated on the surface of the copper plating layer 3, and the photoresist was exposed to ultraviolet rays through a photomask masking the sections for electrolytic copper plating, after which it was developed to form an electrolytic plating resist 4.

(2f) Electrolytic Copper Plating

As shown in FIG. 6(f), a copper sulfate bath was used under conditions of 25° C. liquid temperature, 1.0 A/dm$^2$ current density for electrolytic copper plating to a thickness of about 20 μm on the copper plating layer 3, to form a second copper layer 5 having a pattern form with circuit conductor width/circuit conductor spacing (L/S)=35/35 μm. On the side opposite the side on which the pattern was formed, a second copper layer 5 was formed, so as to form pads with 600 μm land diameters for solder ball connection.

(2 g) Electrolytic Nickel Plating

As shown in FIG. 7(g), an electrolytic nickel plating solution with the following composition, containing no brightening agent, was used under conditions of 55° C. liquid temperature, 1.5 A/dm$^2$ current density, so as to obtain an approximately 3 μm-thick electrolytic nickel plating on the second copper layer 5, to form a nickel layer 6 on the second copper layer 5.

Composition of electrolytic nickel plating solution (Watt bath)
Nickel sulfate: 240 g/L
Nickel chloride: 45 g/L
Boric acid: 30 g/L
Surfactant: 3 ml/L
(Trade name: Anti-Pit Agent #62, Japan Pure Chemical Co., Ltd.)
pH: 4

(2h) Release of Electrolytic Plating Resist

As shown in FIG. 7(h), the resist release solution HTO (trade name of Nichigo-Morton Co., Ltd.) was used to remove the electrolytic plating resist 4.

(2i) Etching

As shown in FIG. 7(i), an etching solution having a composition of 20 g/L sulfuric acid and 10 g/L hydrogen peroxide, as the major components, was used to remove the copper (copper plating layer 3) on the sections covered by the electrolytic plating resist 4, by etching (2j) Formation of Solder Resist As shown in FIG. 7(j), the photosensitive solder resist "PSR-4000 AUS5" (trade name of Taiyo Ink Manufacturing Co., Ltd.) was coated onto the top surface of the etched substrate using a roll coater, to a post-curing thickness of 40 μm. This was followed by exposure and development to form a solder resist 7 with openings at prescribed locations on the conductor circuit. On the lower surface, a solder resist 7 with 500 μm opening diameters was formed on copper pads with land diameters of 600 μm, for formation of a pads for solder ball connection.

(2k) Electroless Gold Plating

As shown in FIG. 7(k), the substrate on which the solder resist 7 was formed was dipped in the displacement gold plating solution HGS-100 (trade name of Hitachi Chemical Co., Ltd.) at 85° C. for 2 minutes, and then rinsed with water for 1 minute. It was then dipped in the reductive gold plating solution HGS-2000 (trade name of Hitachi Chemical Co., Ltd.) at 70° C. for 45 minutes and further rinsed with water for 5 minutes. The total film thickness of the gold layer 8 obtained by displacement gold plating and reductive gold plating was 0.5 μm.

(Evaluation of Properties)

The obtained substrate for mounting a semiconductor chip was used for evaluation of the fine-pitch wiring formability, wire bondability, solder connection reliability and solder resist adhesion, in the same manner as Example 1. The obtained results are shown in Table 1.

Example 10

Production of Substrate for Mounting a Semiconductor Chip

Following steps (1a)-(1g) in Example 1, the electrolytic palladium plating solution PARABRITE SST-L (trade name of Japan Pure Chemical Co., Ltd.) was used for electrolytic palladium plating on the surface of the nickel layer 6 at 60° C., 1-A/dm$^2$ for 40 seconds, to deposit a 0.2 μm-thick palladium plating film (palladium layer). Next, after carrying out steps (1h)-(1j) in Example 1, it was dipped into the reductive palladium plating solution PALET (trade name of Kojima Chemicals Co., Ltd.) at 70° C. for 1 minute, to deposit a 0.1 μm reductive palladium plating film (palladium layer). Step (1k) of Example 1 was then carried out in the same manner except for dipping the displacement gold plating from those steps in HGS-100 (trade name of Hitachi Chemical Co., Ltd.) at 85° C. for 10 minutes, to obtain a substrate for mounting a semiconductor chip.

(Evaluation of Properties)

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold layer surface was also evaluated in the same manner as Example 1. The obtained results are shown in Table 2.

Comparative Example 1

Production of Substrate for Mounting a Semiconductor Chip

After carrying out steps (1a)-(1f) of Example 1, steps (1h)-(1j) were carried out without conducting step (1g) (electrolytic nickel plating).

The substrate on which the solder resist was formed was dipped in the plating activation treatment solution SA-100 (trade name of Hitachi Chemical Co., Ltd.) at 25° C. for 5 minutes and rinsed with water for 1 minute, after which it was dipped in the electroless nickel plating solution Nickel PS-100 (trade name of Hitachi Chemical Co., Ltd.) at 85° C. for 12 minutes, and rinsed with water for 1 minute. This formed a 3 μm electroless nickel plating film on the second copper layer.

Next, the substrate on which the electroless nickel plating film had been formed was dipped in the displacement gold plating solution HGS-100 (trade name of Hitachi Chemical Co., Ltd.) at 85° C. for 10 minutes and rinsed with water for 1 minute, after which it was dipped in the reductive gold plating solution HGS-2000 (trade name of Hitachi Chemical Co., Ltd.) at 70° C. for 45 minutes and rinsed with water for 5 minutes. This yielded a substrate for mounting a semiconductor chip. The total film thickness of the gold layer obtained by displacement gold plating and reductive gold plating was 0.5 μm.

(Evaluation of Properties)

Figure 12:
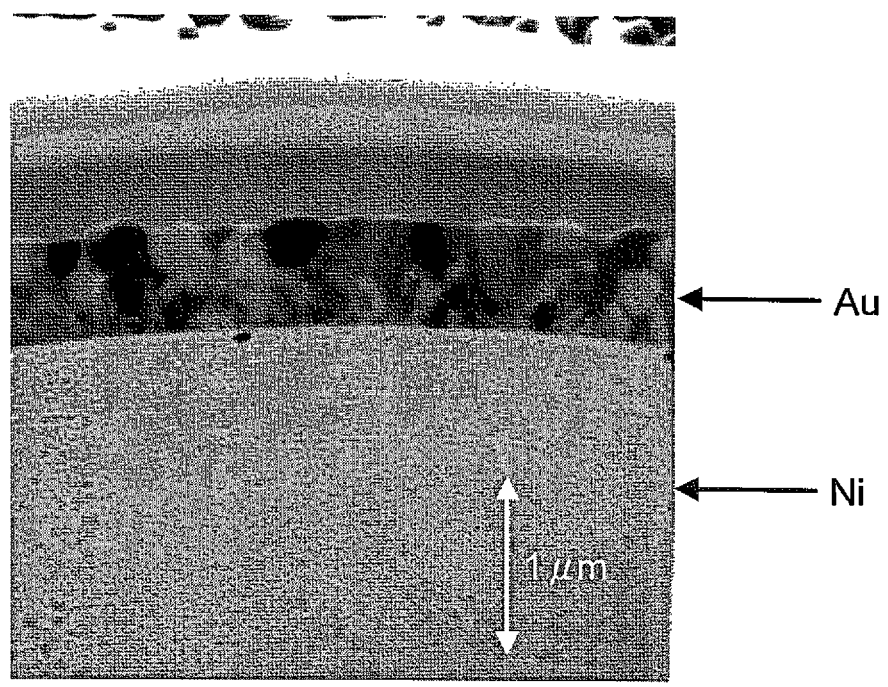
FIG. 12 is a photograph showing the results of observation of the nickel layer/gold layer of Comparative Example 1, by FIB/SIM.

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold layer surface was also evaluated in the same manner as Example 1. The obtained results are shown in Table 2. The crystal grain sizes of nickel and gold in the nickel layer and gold layer were also observed by FIB/SIM in the same manner as Example 1. The obtained results are shown in FIG. 12. The crystal grain size on the surface of the nickel layer contacting with the gold layer was also measured by EBSD, in the same manner as Example 1. The obtained results are shown in Table 3.

Comparative Example 2

Production of Substrate for Mounting a Semiconductor Chip

After carrying out steps (1a)-(1f) of Example 1, steps (1h)-(1j) were carried out without conducting step (1g) (electrolytic nickel plating).

Next, the substrate on which the solder resist 7 had been formed was dipped for 5 minutes in a displacement palladium plating solution with the following composition, as a plating activation treatment solution, and then rinsed with water and dried to form a displacement palladium plating film on the second copper layer.
Composition of displacement palladium plating solution
Palladium chloride as (Pd): 100 mg/L
Ammonium chloride: 10 g/L
pH: 2 (adjusted with hydrochloric acid)

The substrate treated by the displacement palladium plating solution was then dipped in a treatment solution with the following composition, rinsed with water, and dried.
Composition of Treatment Solution
Potassium thiosulfate: 50 g/L
pH regulator: sodium citrate
pH: 6

The substrate was dipped in the electroless nickel plating solution Nickel PS-100 (trade name of Hitachi Chemical Co., Ltd.) at 85° C. for 12 minutes, and rinsed with water for 1 minute. This formed a 3 μm electroless nickel plating film on the palladium plating film. Next, the substrate was dipped in the displacement gold plating solution HGS-100 (trade name of Hitachi Chemical Co., Ltd.) at 85° C. for 10 minutes and rinsed with water for 1 minute, after which it was dipped in the reductive gold plating solution HGS-2000 (trade name of Hitachi Chemical Co., Ltd.) at 70° C. for 45 minutes and rinsed with water for 5 minutes. This yielded a substrate for mounting a semiconductor chip. The total film thickness of the gold layer obtained by displacement gold plating and reductive gold plating was 0.5 μm.

(Evaluation of Properties)

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The crystal grain size on the surface of the nickel layer contacting with the gold layer was also measured by EBSD, in the same manner as Example 1. The obtained results are shown in Table 3.

Comparative Example 3

Production of Substrate for Mounting a Semiconductor Chip

After carrying out steps (1a)-(1f) of Example 1, steps (1h)-(1j) were carried out without conducting step (1g) (electrolytic nickel plating).

Next, the substrate was dipped for 5 minutes in a displacement palladium plating solution with the following composition, as a plating activation treatment solution, and then rinsed with water and dried to form a displacement palladium plating film on the second copper layer. Composition of displacement palladium plating solution
Hydrochloric acid (35%): 70 ml/L
Palladium chloride as (Pd): 50 mg/L
Hypophosphorous acid: 100 mg/L
Acidity: approximately 0.8N The substrate was then treated with a displacement palladium plating solution and dipped in the electroless nickel plating solution Nickel PS-100 (trade name of Hitachi Chemical Co., Ltd.) at 85° C. for 12 minutes, and rinsed with water for 1 minute. This formed a 3 μm electroless nickel plating film on the palladium plating film. Next, the substrate was dipped in the displacement gold plating solution HGS-100 (trade name of Hitachi Chemical Co., Ltd.) at 85° C. for 10 minutes and rinsed with water for 1 minute, after which it was dipped in the reductive gold plating solution HGS-2000 (trade name of Hitachi Chemical Co., Ltd.) at 70° C. for 45 minutes and rinsed with water for 5 minutes. This yielded a substrate for mounting a semiconductor chip. The total film thickness of the gold layer obtained by displacement gold plating and reductive gold plating was 0.5 μm.

(Evaluation of Properties)

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The crystal grain size on the surface of the nickel layer contacting with the gold layer was also measured by EBSD, in the same manner as Example 1. The obtained results are shown in Table 3.

Comparative Example 4

Production of Substrate for Mounting a Semiconductor Chip

A substrate for mounting a semiconductor chip was obtained in the same manner as Example 1, except that in step (1g), an electrolytic nickel plating solution with the following composition, containing a brightening agent (primary brightening agent), was used under conditions of 55° C. liquid temperature, 1.5 A/dm$^2$ current density, so as to obtain an approximately 3 μm-thick electrolytic nickel plating on the second copper layer, to form a nickel layer on the second copper layer. Composition of electrolytic nickel plating solution Nickel sulfate: 240 g/L
Nickel chloride: 45 g/L
Boric acid: 30 g/L
Surfactant: 3 ml/L
(Trade name: Anti-Pit Agent #62, Japan Pure Chemical Co., Ltd.)
Saccharin (brightening agent): 2 g/L
pH: 4

(Evaluation of Properties)

Figure 13:
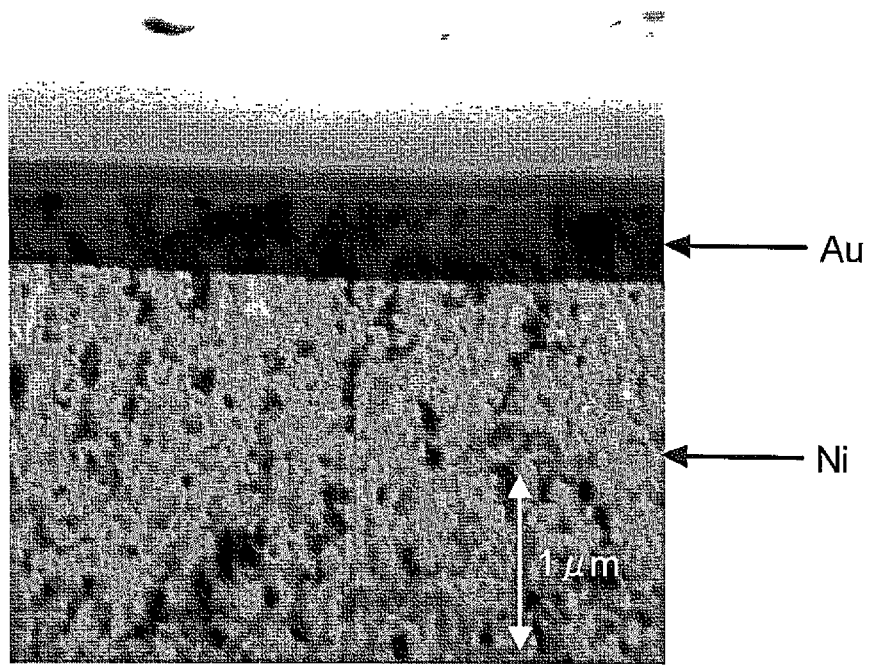
FIG. 13 is a photograph showing the results of observation of the nickel layer/gold layer of Comparative Example 4, by FIB/SIM.

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold layer surface was also evaluated in the same manner as Example 1. The obtained results are shown in Table 2. The crystal grain sizes of nickel and gold in the nickel layer and gold layer were also observed by FIB/SIM in the same manner as Example 1. The obtained results are shown in FIG. 13. The crystal grain size of the nickel layer contacting with the gold layer was measured by EBSD. The obtained results are shown in Table 3.

Comparative Example 5

Production of Substrate for Mounting a Semiconductor Chip

After carrying out steps (1a)-(1f) of Example 1, steps (1h)-(1j) were carried out without conducting step (1g) (electrolytic nickel plating).

Next, the substrate on which the solder resist had been formed was dipped in the plating activation treatment solution SA-100 (trade name of Hitachi Chemical Co., Ltd.) at 25° C. for 5 minutes, and rinsed with water for 1 minute. It was then dipped in the electroless nickel plating solution Nickel PS-100 (trade name of Hitachi Chemical Co., Ltd.) at 85° C. for 12 minutes, and rinsed with water for 1 minute. This formed a 3 μm electroless nickel plating film on the second copper layer.

Next, the strike electrolytic gold plating solution ACID STRIKE (trade name of Japan Pure Chemical Co., Ltd.) was used for strike electrolytic gold plating on the electroless nickel plating film at 40° C., 2 A/dm$^2$ for 20 seconds. Also, the electrolytic gold plating solution TEMPERESIST (trade name of Japan Pure Chemical Co., Ltd.) was used for electrolytic gold plating at 70° C., 0.3 A/dm$^2$ for 4 minutes. This yielded a substrate for mounting a semiconductor chip. The total film thickness of the gold layers formed by strike electrolytic gold plating and electrolytic gold plating was 0.5 μm.

(Evaluation of Properties)

Figure 14:
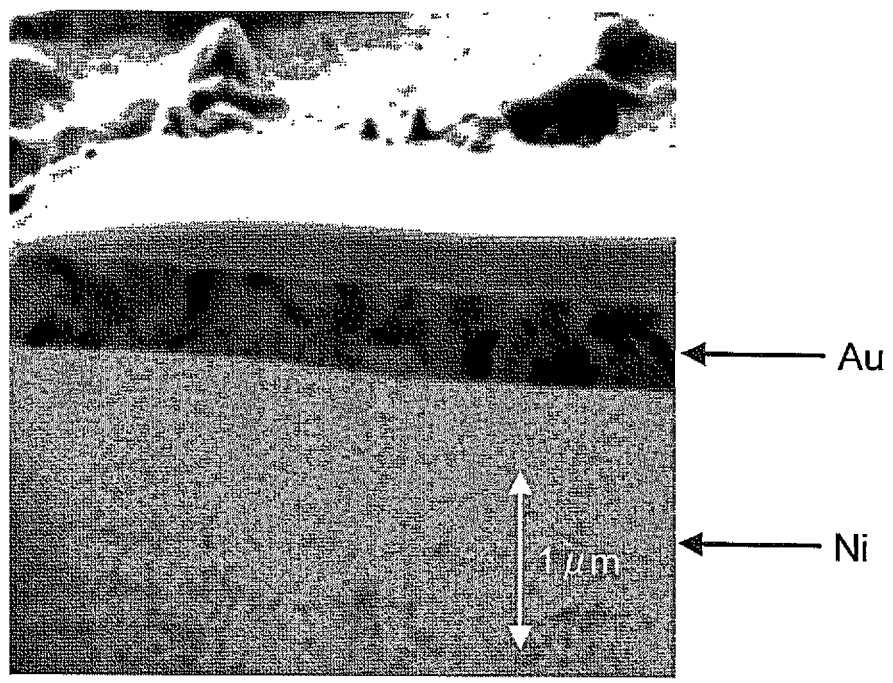
FIG. 14 is a photograph showing the results of observation of the nickel layer/gold layer of Comparative Example 5, by FIB/SIM.

The obtained substrate for mounting a semiconductor chip was used for evaluation of the fine-pitch wiring formability, wire bondability, solder connection reliability and solder resist adhesion, in the same manner as Example 1. The obtained results are shown in Table 1. The state of nickel diffusion into the gold layer surface was also evaluated in the same manner as Example 1. The obtained results are shown in Table 2. The crystal grain sizes of nickel and gold in the electroless nickel plating film and gold layer were also observed by FIB/SIM in the same manner as Example 1. The obtained results are shown in FIG. 14. The crystal grain size on the surface of the electroless nickel plating film contacting with the gold layer was also measured by EBSD, in the same manner as Example 1. The obtained results are shown in Table 3.

TABLE 1

| | Fine-pitch wiring formability | Wire bondability 150° C. High-temperature standing time | | | | | | Solder connection reliability 150° C. High-temperature standing time | | | | Solder resist adhesion |
|---|---|---|---|---|---|---|---|---|---|---|---|---|
| | L/S = 35 μm/35 μm | 0 | 3 | 10 | 50 | 100 | 200 | 0 | 100 | 300 | 1000 | |
| Example 1 | A | B | B | B | B | B | C | A | A | A | B | B |
| Example 2 | A | A | A | A | A | A | B | A | A | A | A | A |
| Example 3 | A | A | A | A | A | A | B | A | A | A | A | A |
| Example 4 | A | A | A | A | A | B | C | A | A | A | B | C |
| Example 5 | A | A | A | A | A | B | C | A | A | A | A | C |
| Example 6 | A | B | B | B | B | B | B | A | A | A | A | B |
| Example 7 | A | B | B | B | B | B | C | A | A | A | B | B |
| Example 8 | A | B | B | B | B | C | C | A | A | A | B | B |
| Example 9 | A | B | B | B | B | B | C | A | A | A | B | C |
| Example 10 | A | A | A | A | A | A | A | A | A | A | A | A |
| Comp. Ex. 1 | E | A | C | C | D | D | D | D | D | D | D | D |
| Comp. Ex. 2 | D | A | C | C | D | D | D | D | D | D | D | D |
| Comp. Ex. 3 | D | A | C | C | D | D | D | D | D | D | D | D |
| Comp. Ex. 4 | A | B | C | C | D | D | D | A | A | A | B | C |
| Comp. Ex. 5 | E | A | C | C | D | D | D | A | B | B | B | D |

TABLE 2

| | 150° C. High-temperature standing time | Type of element (at %) | | |
|---|---|---|---|---|
| | | Cu | Ni | Au |
| Example 1 | 50 | 1.4 | 3.2 | 41.9 |
| | 100 | 3.4 | 3.9 | 38.9 |
| | 200 | 5.5 | 5.3 | 34.3 |
| Example 2 | 50 | 1.2 | 0 | 39.5 |
| | 100 | 3.7 | 0 | 40.2 |
| | 200 | 6.1 | 0 | 37.4 |
| Example 3 | 50 | 1 | 0 | 39.5 |
| | 100 | 2.5 | 0 | 39.1 |
| | 200 | 6.3 | 0 | 36.3 |
| Example 4 | 50 | 1 | 2.1 | 39.5 |
| | 100 | 2.9 | 3.5 | 34.3 |
| | 200 | 6.3 | 5.9 | 31.2 |
| Example 5 | 50 | 1.2 | 0 | 39.8 |
| | 100 | 3 | 0 | 37.6 |
| | 200 | 6.7 | 0 | 36.9 |
| Example 6 | 50 | 0 | 0 | 39.5 |
| | 100 | 0 | 0 | 40.1 |
| | 200 | 0 | 0 | 37.3 |
| Example 7 | 50 | 1.2 | 4.3 | 38.5 |
| | 100 | 3.2 | 6.5 | 33.5 |
| | 200 | 5.9 | 8.5 | 32.1 |
| Example 8 | 50 | 1.4 | 6.1 | 35.2 |
| | 100 | 3.5 | 7.8 | 32.1 |
| | 200 | 6.1 | 10.6 | 31.2 |
| Example 10 | 50 | 0 | 0 | 39.5 |
| | 100 | 0 | 0 | 40.1 |
| | 200 | 0 | 0 | 37.3 |
| Comp. Ex. 1 | 50 | 0 | 12.3 | 30.3 |
| | 100 | 0 | 15.6 | 24.5 |
| | 200 | 0 | 20.3 | 20.5 |
| Comp. Ex. 4 | 50 | 1.1 | 11.6 | 29.6 |
| | 100 | 3.2 | 15.3 | 20.5 |
| | 200 | 7.7 | 18.9 | 12.6 |
| Comp. Ex. 5 | 50 | 0 | 12.5 | 32.3 |
| | 100 | 0 | 16.3 | 25.6 |
| | 200 | 0 | 21.3 | 21.4 |

TABLE 3

| | Ni crystal grain size on uppermost surface (μm) |
|---|---|
| Example 1 | 1.8 |
| Example 7 | 1 |
| Example 8 | 0.25 |
| Comparative Example 1 | Unmeasurable (amorphous) |
| Comparative Example 2 | Unmeasurable (amorphous) |
| Comparative Example 3 | Unmeasurable (amorphous) |
| Comparative Example 4 | 0.1 |
| Comparative Example 5 | Unmeasurable (amorphous) |

Table 1 confirmed that, in contrast to Comparative Examples 1-5, Examples 1-10 had no formation of bridging even with fine-pitch wiring, and excellent fine-pitch wiring formability, as well as satisfactory wire bondability and solder connection reliability. In particular, Table 1 and Table 2 confirmed that the wire bondability decreases as copper or nickel diffuses into the surface of the gold layer. In addition, Table 3 confirmed that the crystal grain sizes of the nickel in the surface of the nickel layer 6 on the gold layer 8 were relatively large in Examples 1, 7 and 8.

Also, as shown in FIG. 9, FIG. 10 and FIG. 11, it was confirmed that each nickel layer 6/gold layer 8 formed by electroless gold plating after electrolytic nickel plating with no brightening agent or with a minimal amount of brightening agent, in Examples 1, 7 and 8, had a large crystal grain size for the nickel in the nickel layer 6, based on FIB/SIM observation, and also a large crystal grain size for the gold in the gold layer. In the case of Example 1, the abundance of nickel in the gold layer 8 after heat treatment for 50 hours was low at 3.2 at %, and the wire bondability was satisfactory.

In contrast, as shown in FIG. 12 or FIG. 14, for example, the particle size of nickel in the electroless gold plating film was not sufficiently large and the particle size of gold in the gold layer also did not increase in Comparative Example 1 or 5, even with electroless gold plating after electroless nickel plating. In the case of Comparative Example 5, the abundance of nickel in the gold layer surface after heat treatment for 50 hours was high at 12.5 at %, and the wire bondability was reduced. Thus, it was demonstrated that the particle size of nickel in the nickel layer formed by electrolytic nickel plating has a major effect on the particle size of gold in the gold layer formed thereover, and also affects the wire bondability.

As explained above, it was confirmed that the method of the invention can produce a substrate for mounting a semiconductor chip that can avoid bridging and that has excellent wire bondability and solder connection reliability.

EXPLANATION OF SYMBOLS

1: Inner board, 2: resin-coated copper foil, 3: copper plating layer, 4: resist (plating resist), 5: second copper layer, 6: nickel layer, 7: solder resist, 8: gold layer, 9: reductive gold plating film, 11: displacement gold plating film, 13: metal layer, 15: insulating layer, 21: insulating layer, 22: copper foil, 30: IVH, 32: first copper layer, 50: conductor circuit, 100: inner layer substrate, 102: inner layer circuit, 104: inner layer via, 110: stack, 120: stack.

The invention claimed is:

1. A method for producing a substrate for mounting a semiconductor chip, comprising steps of:
    (a) a resist-forming step, wherein a resist is formed on a first copper layer of a stack comprising an inner board with an inner layer circuit on a surface of the inner board, and wherein the first copper layer formed on the inner board is separated by an insulating layer so as to partially connect with the inner layer circuit, at the sections other than those that are to constitute a conductor circuit,
    (b) a conductor circuit-forming step, wherein a second copper layer is formed by electrolytic copper plating on the sections of the first copper layer that are to constitute the conductor circuit, to obtain a conductor circuit comprising the first copper layer and the second copper layer,
    (c) a nickel layer-forming step, wherein a nickel layer having an average crystal grain size of at least 0.25 μm on the side opposite the conductor circuit is formed by electrolytic nickel plating on at least part of the conductor circuit,
    (d) a resist removal step, wherein the resist is removed,
    (e) an etching step, wherein the first copper layer on the sections covered by the resist is removed by etching,
    (f) a solder resist-forming step, wherein a solder resist is formed on the surface so that at least part of the conductor circuit on which the nickel layer has been formed is exposed, and
    (g) a gold layer-forming step, wherein a gold layer is formed by electroless gold plating on at least part of the conductor circuit on which the nickel layer has been formed, wherein the steps are performed in the order of (a) to (g).

2. The method for producing a substrate for mounting a semiconductor chip according to claim 1, wherein, in the resist-forming step (a),
    after a resin-coated copper foil having an insulating layer composed mainly of a resin laminated on a copper foil has been laminated on an inner board with the insulating layer facing the inner board side, a via hole has been formed in the resin-coated copper foil laminated on the inner board so as to expose part of the inner layer circuit, and a copper plating layer has been formed by electroless copper plating so as to cover the copper foil and the interior of the via hole, to obtain a stack with a first copper layer that comprises a copper foil and a copper plating layer and is partially connected to the inner layer circuit, the resist is formed on the first copper layer of the stack, at the sections other than those that are to serve as the conductor circuit.

3. The method for producing a substrate for mounting a semiconductor chip according to claim 2, wherein the thickness of the copper foil of the resin-coated copper foil is no greater than 5 μm.

4. The method for producing a substrate for mounting a semiconductor chip according to claim 1, wherein in the resist-forming step (a), after a non-conductive film has been laminated on an inner board having an inner layer circuit on the surface to form an insulating layer, a via hole has been formed in the insulating layer laminated on the inner board so as to expose part of the inner layer circuit, and a copper plating layer has been formed by electroless copper plating so as to cover the insulating layer and the interior of the via hole, to obtain a stack with a first copper layer that comprises a copper plating layer and is partially connected to the inner layer circuit, a resist is formed on the first copper layer of the stack at the sections other than those that are to serve as the conductor circuit.

5. The method for producing a substrate for mounting a semiconductor chip according to claim 1, which comprises, after the conductor circuit-forming step (b) and before the nickel layer-forming step (c), an upper resist-forming step, wherein an upper resist is additionally formed covering the resist and conductor circuit so as to leave part of the conductor circuit exposed, the nickel layer being formed in the nickel layer-forming step on the sections of the conductor circuit that have been exposed through the upper resist, and both the resist and upper resist being removed in the resist removal step.

6. The method for producing a substrate for mounting a semiconductor chip according to claim 1, which comprises, after the nickel layer-forming step (c) and before the gold layer-forming step (g), a metal layer-forming step, wherein a metal layer comprising at least one type of metal selected from the group consisting of cobalt, palladium, platinum and gold is formed on the nickel layer by electroless plating or electrolytic plating.

7. The method for producing a substrate for mounting a semiconductor chip according to claim 1, which comprises, after the solder resist-forming step (f) and before the gold layer-forming step (g), a metal layer-forming step, wherein a palladium layer is formed by electroless palladium plating on the nickel layer-formed conductor circuit which has been exposed through the solder resist.

8. The method for producing a substrate for mounting a semiconductor chip according to claim 7, wherein in the metal layer-forming step, the palladium layer is formed by displacement palladium plating followed by reductive palladium plating.

9. The method for producing a substrate for mounting a semiconductor chip according to claim 1, wherein in the gold layer-forming step (g), the electroless gold plating is performed using an electroless gold plating solution comprising a reducing agent, the reducing agent used being one that does not generate hydrogen gas by oxidation.

10. The method for producing a substrate for mounting a semiconductor chip according to claim 1, wherein in the gold layer-forming step (g), the gold layer is formed by displacement gold plating followed by reductive gold plating.

11. The method for producing a substrate for mounting a semiconductor chip according to claim 1, wherein the thickness of the gold layer is 0.005 μm or greater.

12. The method for producing a substrate for mounting a semiconductor chip according to claim 1, wherein at least part of the conductor circuit is a solder connecting terminal or wire bonding terminal.

* * * * *